(12) United States Patent  
Kim et al.

(10) Patent No.: US 11,177,273 B2  
(45) Date of Patent: Nov. 16, 2021

(54) NONVOLATILE MEMORY DEVICE INCLUDING ROW DECODER

(71) Applicant: SAMSUNG ELECTRONICS CO., LTD., Suwon-si (KR)

(72) Inventors: Chang-Bum Kim, Seoul (KR); Sung-Hoon Kim, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 300 days.

(21) Appl. No.: 15/996,479

(22) Filed: Jun. 3, 2018

(65) Prior Publication Data

US 2019/0115361 A1 Apr. 18, 2019

(30) Foreign Application Priority Data

Oct. 16, 2017 (KR) .................. 10-2017-0134249

(51) Int. Cl.
*H01L 27/1158* (2017.01)
*H01L 27/1157* (2017.01)
(Continued)

(52) U.S. Cl.
CPC .... *H01L 27/11582* (2013.01); *G11C 16/0466* (2013.01); *G11C 16/0483* (2013.01);
(Continued)

(58) Field of Classification Search
CPC ............ H01L 23/528; H01L 27/11582; H01L 27/11575; H01L 23/5226; H01L 27/11568;
(Continued)

(56) References Cited

U.S. PATENT DOCUMENTS 6,331,734 B1 12/2001 Hieda
6,573,544 B1 * 6/2003 Lee ...................... G11C 7/1048
257/296
(Continued)

FOREIGN PATENT DOCUMENTS

JP 200077407 A 3/2000
JP 2010199311 A 9/2010
(Continued)

OTHER PUBLICATIONS

N. Menezes et al., "Skew Reduction in Clock Trees Using Wire Width Optimization," Proceedings of IEEE Custom Integrated Circuits Conference, May 1993.
(Continued)

*Primary Examiner* — Benjamin Tzu-Hung Liu
(74) *Attorney, Agent, or Firm* — Volentine, Whitt & Francos, PLLC

(57) ABSTRACT

A nonvolatile memory device includes a substrate; a memory cell array formed on the substrate in a vertically stacked structure; and a row decoder configured to supply a row line voltage to the memory cell array, the row decoder including a plurality of pass transistors. The row line voltage is supplied through a plurality of row lines connecting the pass transistors to the memory cell array. Each of the row lines includes a wiring line parallel with a main surface of the substrate and a contact perpendicular to the main surface of the substrate. The wiring line of at least one row line among the row lines includes a plurality of conductive lines.

15 Claims, 24 Drawing Sheets

(51) Int. Cl.
G11C 16/04 (2006.01)
G11C 16/08 (2006.01)
H01L 23/522 (2006.01)
H01L 27/1156 (2017.01)
G11C 16/10 (2006.01)
G11C 16/26 (2006.01)
H01L 27/11582 (2017.01)
H01L 27/11575 (2017.01)
H01L 23/528 (2006.01)
H01L 27/11568 (2017.01)
H01L 27/11573 (2017.01)

(52) U.S. Cl.
CPC ............ *G11C 16/08* (2013.01); *H01L 23/528* (2013.01); *H01L 23/5226* (2013.01); *H01L 27/11568* (2013.01); *H01L 27/11573* (2013.01); *H01L 27/11575* (2013.01); *G11C 16/10* (2013.01); *G11C 16/26* (2013.01)

(58) Field of Classification Search
CPC ........... H01L 27/11573; G11C 16/0466; G11C 16/0483; G11C 16/08; G11C 16/10; G11C 16/26; G11C 13/0028
See application file for complete search history.

(56) References Cited

U.S. PATENT DOCUMENTS

| | | |
|---|---|---|
| 6,787,823 B2 | 9/2004 | Shibutani |
| 7,564,134 B2 | 7/2009 | Yang et al. |
| 7,852,675 B2 * | 12/2010 | Maejima .......... H01L 27/11551 |
| | | 365/185.11 |
| 7,989,880 B2 | 8/2011 | Wada et al. |
| 9,190,150 B2 | 11/2015 | Sakanushi |
| 9,553,106 B1 | 1/2017 | Sung et al. |
| 9,583,438 B2 | 2/2017 | Liaw et al. |
| 9,905,510 B2 | 2/2018 | Komori |
| 2008/0073672 A1 * | 3/2008 | Kato ................. H01L 27/11526 |
| | | 257/209 |
| 2010/0295648 A1 | 11/2010 | Huang et al. |
| 2011/0100693 A1 * | 5/2011 | Kwon .............. H01L 27/11521 |
| | | 174/260 |
| 2013/0126957 A1 * | 5/2013 | Higashitani ....... H01L 27/11519 |
| | | 257/314 |
| 2014/0138765 A1 * | 5/2014 | Lee ..................... H01L 29/7827 |
| | | 257/330 |
| 2016/0260698 A1 * | 9/2016 | Oh .................... H01L 27/11573 |
| 2016/0307632 A1 | 10/2016 | Lee et al. |
| 2017/0133063 A1 * | 5/2017 | Singh .................... G11C 5/063 |

FOREIGN PATENT DOCUMENTS

JP 2017147337 A 8/2017
KR 1020130047046 A 5/2013

OTHER PUBLICATIONS

Korean Office Action dated May 11, 2021 Cited in Corresponding Korean Application No. 2017-134249.
Japanese Office Action dated Apr. 20, 2021 Cited in Corresponding Japanese Application No. 2018-191884.

* cited by examiner

NONVOLATILE MEMORY DEVICE INCLUDING ROW DECODER

CROSS-REFERENCE TO RELATED APPLICATION

This application claims the benefit of Korean Patent Application No. 10-2017-0134249, filed on Oct. 16, 2017, in the Korean Intellectual Property Office, the subject matter of which is incorporated herein in its entirety by reference.

BACKGROUND

The inventive concept relates to nonvolatile memory devices including a row decoder. More particularly, the inventive concept relates to a vertically stacked nonvolatile memory device connected to a pass transistor of a row decoder.

Memory devices may be classified as volatile or nonvolatile memory devices according to their operative nature. Flash memory is one type of nonvolatile memory commonly used in mobile phones, digital cameras, portable digital assistants (PDAs), portable computer devices, stationary computer devices, and the like.

With continuing demand for high data storage capacity and miniaturization of nonvolatile memory devices, various types of vertically stacked memory devices have been developed. In this regard, the term "vertically stacked memory device" refers to a memory device including a plurality of memory cells or memory cell arrays vertically stacked on a substrate.

SUMMARY

The inventive concept provides a nonvolatile memory device for reducing resistance of a conductive line connecting a memory cell block including a plurality of memory cells with a plurality of pass transistors.

According to an aspect of the inventive concept, there is provided a nonvolatile memory device including; a vertically stacked memory cell array formed on a substrate having a main surface, and a row decoder supplying a row line voltage to the memory cell array through a plurality of row lines. The row decoder includes a plurality of pass transistors, such that each one the plurality of row lines comprises at least one wiring line connected to the memory cell array via at least one of the pass transistors, and one of the plurality of row lines comprises a plurality of wiring lines extending in a direction parallel to the main surface of the substrate and a contact extending in a direction perpendicular to the main surface of the substrate.

According to another aspect of the inventive concept, there is provided a nonvolatile memory device including; a peripheral circuit area formed on a substrate having a main surface and comprising a plurality of pass transistors, and a memory cell array formed on the peripheral circuit area in a vertically stacked structure, the memory cell array being connected to the pass transistors through a plurality of row lines. Each of the row lines includes a first wiring line formed on an upper layer of the memory cell array from the main surface of the substrate, a second wiring line formed in the peripheral circuit area, and a contact connecting the first wiring line with the second wiring line, and at least one among the first wiring line, the contact, and the second wiring line comprised in a first row line among the row lines comprises a plurality of conductive lines.

According to another aspect of the inventive concept, there is provided a nonvolatile memory device including; a vertically stacked memory cell formed on a substrate having a main surface, and a row decoder supplying a row line voltage to the memory cell array, the row decoder comprising a plurality of pass transistors. The row line voltage is supplied through a plurality of row lines connecting the pass transistors to the memory cell array, each of the row lines comprises a wiring line parallel with the main surface of the substrate and a contact perpendicular to the main surface of the substrate, and at least part of a wiring line of a first row line among the plurality of row lines has a wider width than wiring lines of the other row lines among the plurality of row lines.

BRIEF DESCRIPTION OF THE DRAWINGS

Embodiments of the inventive concept will be more clearly understood from the following detailed description taken in conjunction with the accompanying drawings in which.

DETAILED DESCRIPTION

Figure 1:
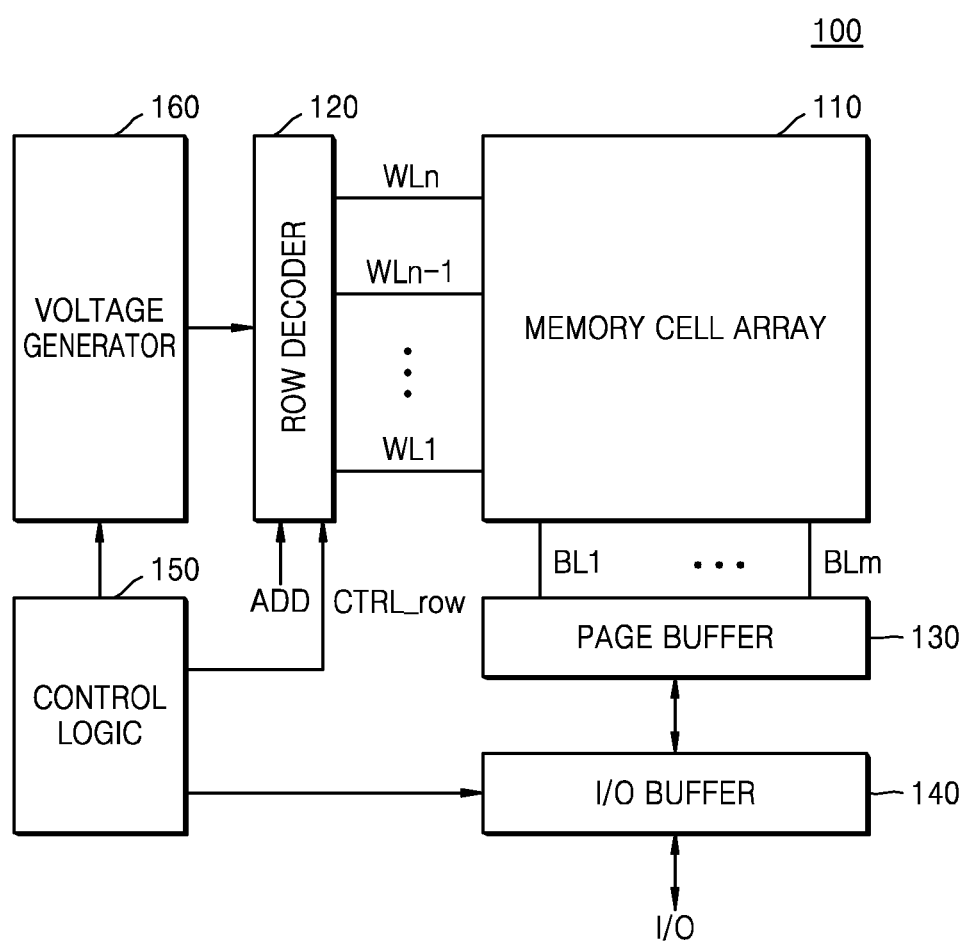
FIG. 1 is a block diagram of a nonvolatile memory device according to an embodiment of the inventive concept.

Figure (FIG. 1 is a block diagram of a nonvolatile memory device according to an embodiment of the inventive concept.

Referring to FIG. 1, a nonvolatile memory device 100 may include a memory cell array 110, a row decoder 120, a page buffer 130, an input/output (I/O) buffer 140, a control logic 150, and a voltage generator 160. The nonvolatile memory device 100 may be nonvolatile memory including flash memory, magnetic random access memory (MRAM), resistance RAM (ReRAM), and ferroelectric RAM (FRAM). The nonvolatile memory device 100 may be any one of various memory devices including a row decoder driving row lines including a word line.

The memory cell array 110 may be connected to the row decoder 120 through word lines WL1 through WLn. The memory cell array 110 may also be connected to the page buffer 130 through bit lines BL0 through BLm. The page buffer 130 may operate as a write driver or a sense amplifier according to an operating mode. For example, during a program operation, the page buffer 130 may transmit a voltage corresponding to data to be programmed to the bit lines BL0 through BLm. During a read operation, the page buffer 130 may sense data stored in a selected memory cell through the bit lines BL0 through BLm and transmit the data to the I/O buffer 140. The I/O buffer 140 may transmit input data to the page buffer 130 or may output data from the page buffer 130.

The control logic 150 may control various elements included in the nonvolatile memory device 100. For example, the control logic 150 may generate internal control signals according to an externally provided command such as a program command or a read command. That is, the control logic 150 may be used to control the voltage generator 160 in order to generate voltage(s) of different levels appropriate to the execution of program and/or read operation(s). The control logic 150 may also control the I/O buffer 140 to control input or output timing of data. In addition, the control logic 150 may generate a control signal CTRL_row for controlling the row decoder 120. The row decoder 120 may select a cell block and a word line in the memory cell array 110 based on the control signal CTRL_row.

The voltage generator 160 may generate various word line voltages to be supplied to the word lines WL1 through WLn, respectively, and a bulk voltage to be supplied to a bulk (e.g., a well region) including memory cells, based on the control of the control logic 150. For example, during a program operation, the voltage generator 160 may generate a program voltage supplied to a selected word line and a pass voltage supplied to an unselected word line. During a read operation, the voltage generator 160 may generate a selected word line voltage and an unselected word line voltage at different levels. The voltage generator 160 may also supply a high erase voltage to a substrate bulk including a selected memory cell array during an erase operation.

The memory cell array 110 may include a plurality of cell blocks. Although one memory cell array and one row decoder are illustrated in FIG. 1, this is just for convenience's sake in the description and one row decoder may be placed for one cell block. Alternatively, one row decoder may be shared by two or more cell blocks. So, the nonvolatile memory device 100 may include fewer row decoders than cell blocks.

The row decoder 120 may be used to "select" one or more cell block(s). For example, word line voltages may be supplied to the word lines WL1 through WLn of a cell block when it is selected, whereas the supply of word lines voltages to the word lines WL1 through WLn of a cell block may be cut off when the cell block is not selected. In order to perform this operation, the row decoder 120 may include a block selector, such that the transmission of word line voltages may be controlled by a switching operation performed in relation to a pass transistor (e.g., TR_P in FIG. 2) included in the block selector.

In some embodiments, the nonvolatile memory device 100 may be a flash memory device and the memory cell array 110 may include a plurality of NAND cell strings. Each cell string may form a channel in a vertical or horizontal direction. Memory cells included in each cell string may be programmed or erased by selective application of a high voltage by the row decoder 120.

The memory cell array 110 may also be connected to the row decoder 120 through other lines besides the word lines WL1 through WLn. For example, the memory cell array 110 may be connected to the row decoder 120 through at least one string selection line SSL and a ground selection line GSL. That is, the string selection line SSL, the word lines WL1 through WLn, and the ground selection line GSL may be singularly or collectively referred to as "row line(s)". A voltage supplied to a row line may be referred to as a row driving voltage. One example of the memory cell array 110 will be described in some additional detail with reference to FIGS. 3, 4 and 5 hereafter.

Figure 2:
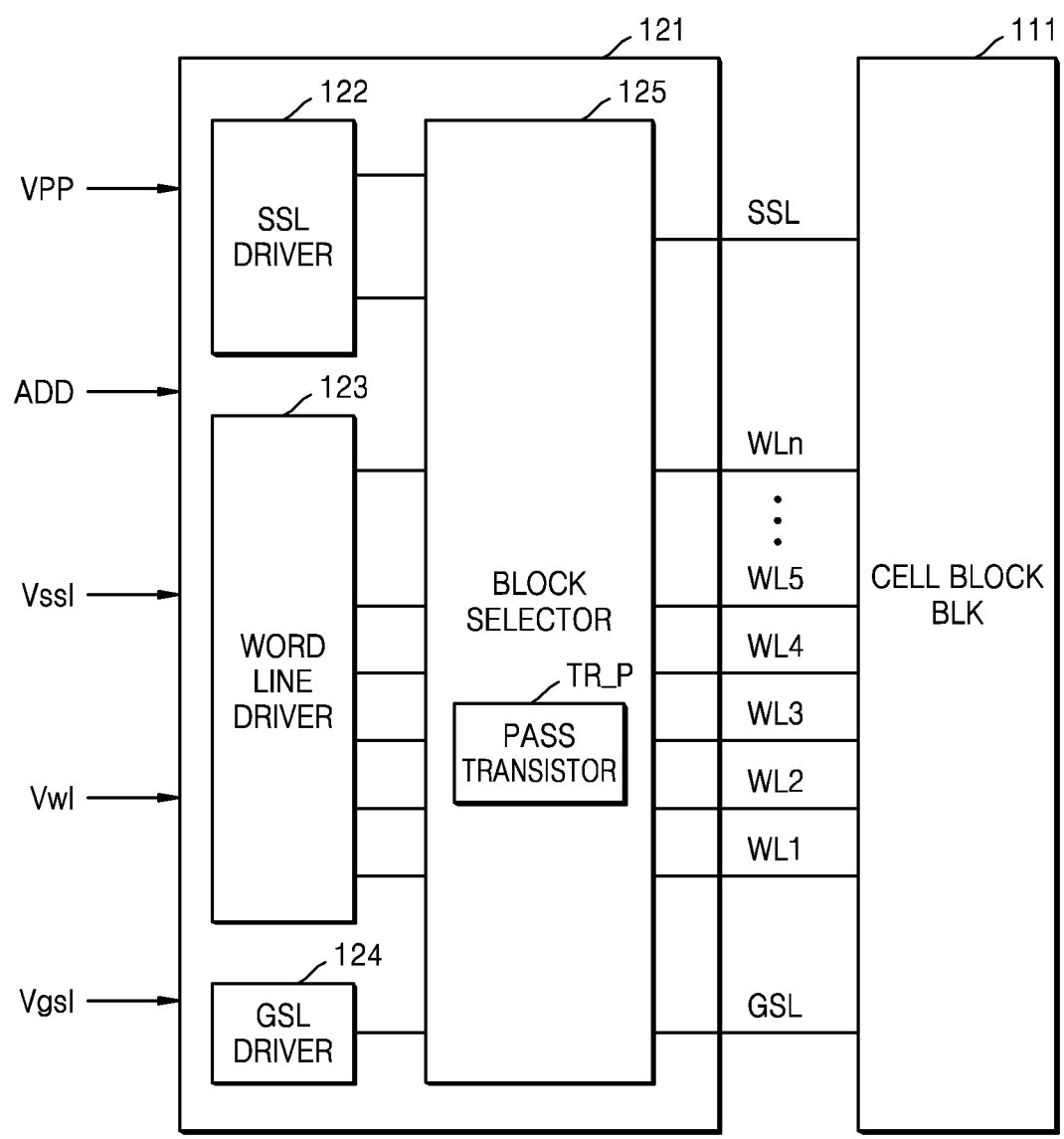
FIG. 2 is a block diagram of a row decoder shown in FIG. 1, according to an embodiment of the inventive concept.

FIG. 2 is a block diagram further illustrating in one example the row decoder 120 of FIG. 1 according to an embodiment of the inventive concept. In the embodiment illustrated of FIG. 2, the nonvolatile memory device 100 is a flash memory device and a row decoder 121 drives flash memory cells. A cell block BLK or 111 shown in FIG. 2 may be one cell block among a plurality of cell blocks included in the memory cell array 110 shown in FIG. 1. Here, the row decoder 121 may be part of the row decoder 120 shown in FIG. 1. Although one string selection line SSL and one ground selection line GSL are placed in the embodiment illustrated in FIG. 2, the numbers of string selection lines and ground selection lines may vary by design.

Referring to FIG. 2, the row decoder 121 includes an SSL driver 122, a word line driver 123, a GSL driver 124, and a block selector 125. The block selector 125 may be used to decode one or more bits in an address ADD in order to select a particular cell block. In some embodiments, the block selector 125 may be between the SSL, word line, and GSL drivers 122 through 124 and the cell block 111.

The SSL driver 122 is connected to the string selection line SSL through the block selector 125. In other words, the SSL driver 122 may drive the string selection line SSL through the block selector 125. For example, the SSL driver 122 may float the string selection line SSL during an erase operation and may supply a high string selection voltage (e.g., a power supply voltage) to the string selection line SSL during a program operation.

Similarly, the word line driver 123 is connected to the word lines WL1 through WLn through the block selector 125. In other words, the word line driver 123 may drive the word lines WL1 through WLn through the block selector 125. For example, a high erase voltage may be supplied to a bulk including the cell block 111, and the word line driver 123 may supply a word line voltage (e.g., a ground voltage) at a low level to the word lines WL1 through WLn during an erase operation. The word line driver 123 may supply a program voltage at a high level to a selected word line and a pass voltage to an unselected word line during a program operation.

Similarly, the GSL driver 124 may drive the ground selection line GSL through the block selector 125. For example, the GSL driver 124 may float the ground selection line GSL during an erase operation and may supply a ground selection voltage (e.g., the ground voltage) at a low level to the ground selection line GSL during a program operation.

The block selector 125 may include a plurality of pass transistors TR_P connected between the SSL, word line, GSL drivers 122 through 124 and the row lines SSL, WL1 through WLn, and GSL. The operations of the row lines SSL, WL1 through WLn, and GSL may be controlled based on the switching operations of the pass transistors TR_P.

According to some embodiments of the inventive concept, when resistance of some row lines among the row lines SSL, WL1 through WLn, and GSL connecting a plurality of pass transistors with the cell block 111 needs to be reduced, or when there is sufficient spare space among the row lines SSL, WL1 through WLn, and GSL, at least one of the row lines SSL, WL1 through WLn, and GSL may have a different layout (or shape), such that the total resistance of the at least one of the row lines SSL, WL1 through WLn, and GSL may be reduced.

Figure 3:
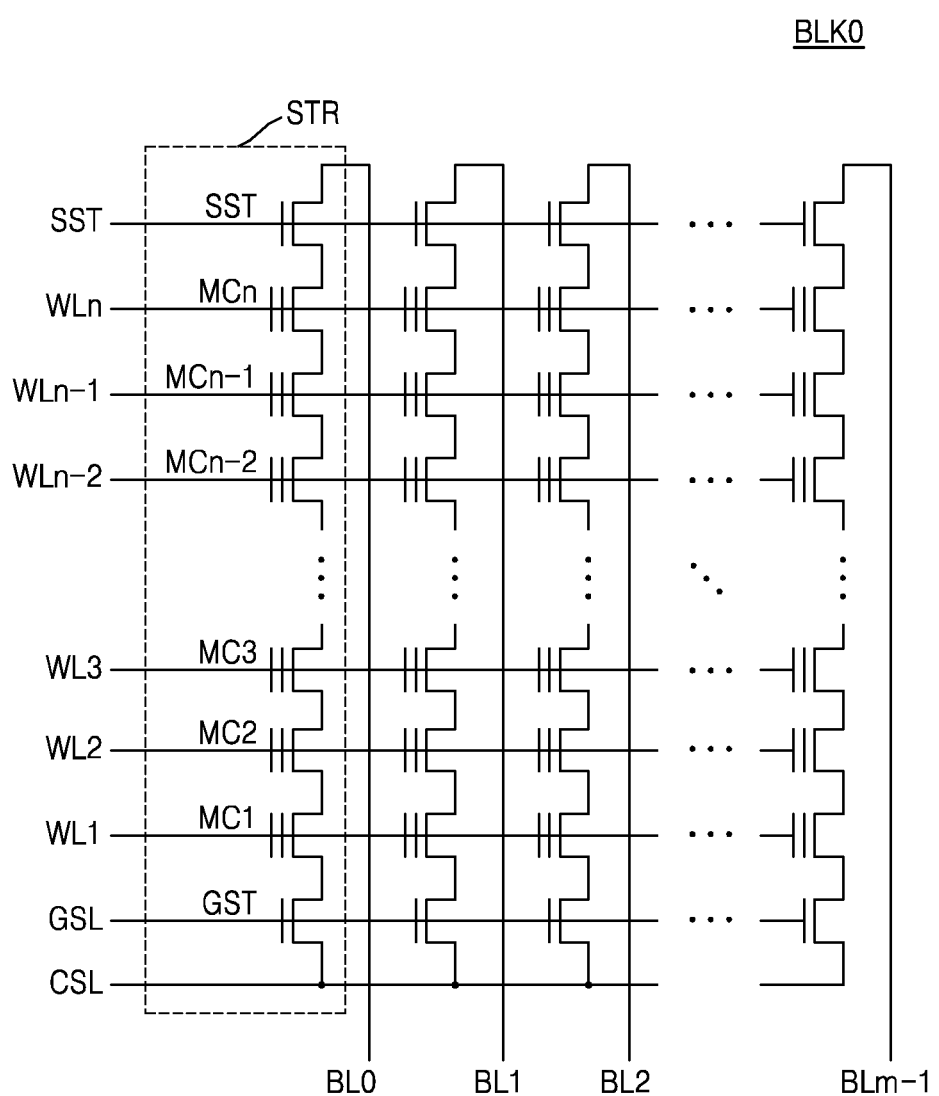
FIG. 3 is a circuit diagram of a memory block according to an embodiment of the inventive concept.

FIG. 3 is a circuit diagram further illustrating in one example the memory block 110 of FIG. 1 according to an embodiment of the inventive concept.

Referring to FIG. 3, the memory cell array 110 may be a horizontal NAND flash memory array including a plurality of memory blocks. A memory block BLK0 may include "m" cell strings STR arranged in a direction of bit lines BL0 through BLm−1, where "m" is an integer of at least 2. Each of the "m" cell strings STR includes a plurality of memory cells MC connected in series.

A NAND flash memory device having the structure shown in FIG. 3 performs an erase operation on each block and performs a program operation on each page corresponding to each of the word lines WL1 through WLn. In the embodiment illustrated in FIG. 3, a single block includes "n" pages for "n" word lines WL1 through WLn. The nonvolatile memory device 100 illustrated in FIG. 1 may include a plurality of memory cell arrays which have the same structure and perform the same operations as the memory cell array 110 described above.

Figure 4:
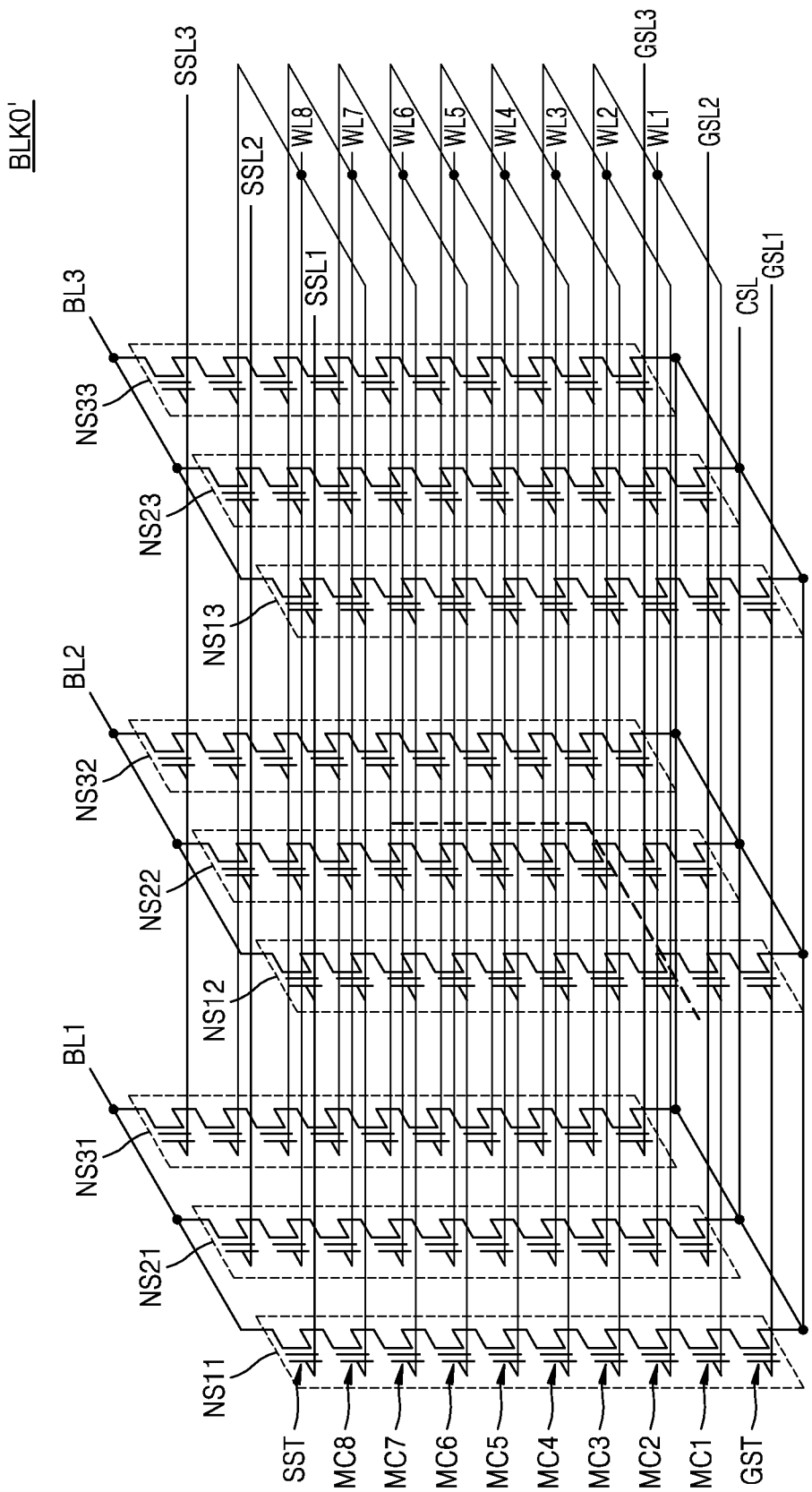
FIG. 4 is a circuit diagram of a memory block, according to another embodiment of the inventive concept.

FIG. 4 is a circuit diagram further illustrating ion one example the memory block 110 of FIG. 1 according to another embodiment of the inventive concept.

Referring to FIG. 4, the memory cell array 110 may be a horizontal NAND flash memory and may include a plurality of memory blocks. In the embodiment illustrated in FIG. 4, a single block includes eight (8) word lines WL1 through WL8. A memory block BLK0' may include a plurality of NAND cell strings NS11 through NS33, a plurality of word lines WL1 through WL8, a plurality of first through third bit lines BL1 through BL3, a plurality of ground selection lines GSL1 through GSL3, a plurality of first through third cell string selection lines SSL1 through SSL3, and a common source line CSL. Here, the number of NAND cell strings, the number of word lines, the number of bit lines, the number of ground selection lines, and the number of cell string selection lines may vary with design.

The NAND cell strings NS11, NS21, and NS31 are provided between the first bit line BL1 and the common source line CSL. The NAND cell strings NS12, NS22, and NS32 are provided between the second bit line BL2 and the common source line CSL. The NAND cell strings NS13, NS23, and NS33 are provided between the third bit line BL3 and the common source line CSL. Each NAND cell string (e.g., NS11) may include a cell string selection transistor SST, a plurality of memory cells MC1 through MC8, and a ground selection transistor GST, which are connected in series.

Cell strings connected in common to one bit line form a single column line. For example, the NAND cell strings NS11, NS21, and NS31 connected in common to the first bit line BL1 may correspond to a first column. The NAND cell strings NS12, NS22, and NS32 connected in common to the second bit line BL2 may correspond to a second column. The NAND cell strings NS13, NS23, and NS33 connected in common to the third bit line BL3 may correspond to a third column.

Cell strings connected to one cell string selection line form a single row. For example, the NAND cell strings NS11, NS12, and NS13 connected to the first cell string selection line SSL1 may correspond to a first row. The NAND cell strings NS21, NS22, and NS23 connected to the second cell string selection line SSL2 may correspond to a second row. The NAND cell strings NS31, NS32, and NS33 connected to the third cell string selection line SSL3 may correspond to a third row.

The cell string selection transistor SST is connected to a corresponding one among the first through third cell string selection lines SSL1 through SSL3. The memory cells MC1 through MC8 are respectively connected to the word lines WL1 through WL8. The ground selection transistor GST is connected to a corresponding one among the ground selection lines GSL1 through GSL3. The cell string selection transistor SST is connected to a corresponding one among the first through third bit lines BL1 through BL3. The ground selection transistor GST is connected to the common source line CSL.

Word lines (e.g., WL1) at the same level are commonly connected. The first through third cell string selection lines SSL1 through SSL3 are separated from one another. The ground selection lines GSL1 through GSL3 are also separated from one another. For example, when memory cells connected to the first word line WL1 and included in the NAND cell strings NS11, NS12, and NS13 are programmed, the first word line WL1 and the first cell string selection line SSL1 are selected. The ground selection lines GSL1 through GSL3 may be connected in common to one another.

Figure 5:
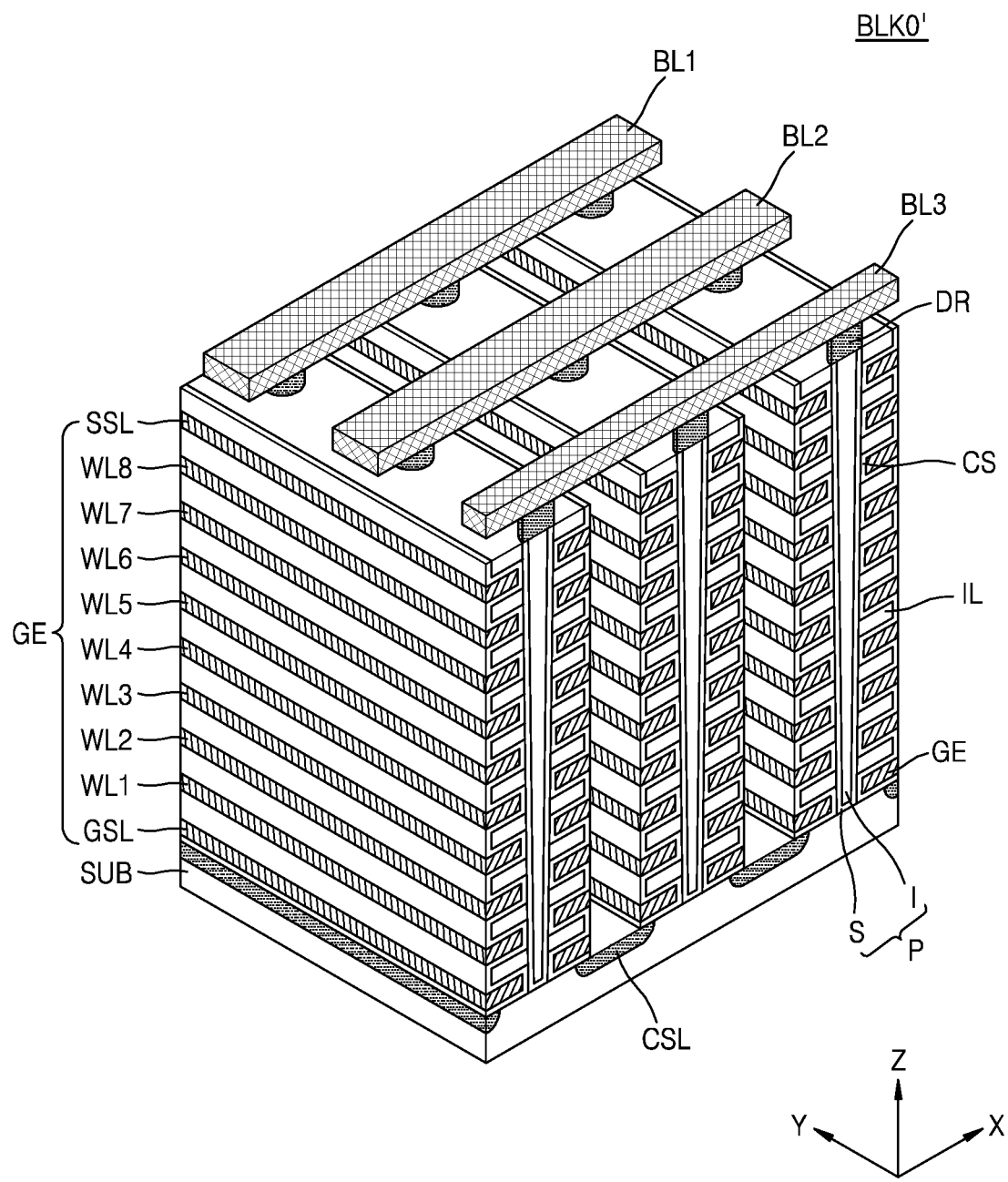
FIG. 5 is a perspective view of the memory block shown in FIG. 4.

FIG. 5 is a perspective view illustrating in one example the memory block BLK0' of FIG. 4.

Referring to FIG. 5, each memory block included in a memory cell array (e.g., the memory cell array 110 of FIG. 1) may be formed in a vertical direction with respect to the primary surface of a substrate SUB (here, assumed to correspond to a horizontal direction substantially orthogonal to the vertical direction). Although the memory block BLK0' includes two selection lines GSL and SSL, eight word lines WL1 through WL8, and three bit lines BL1 through BL3 in the embodiment illustrated in FIG. 5, the numbers of selection lines, word lines, and bit lines may be decreased or increased as required by specific design.

A common source line CSL is provided on the substrate SUB. The common source line CSL has a first conductivity type (e.g., a p-type), extends in a second direction (e.g., a Y-direction) on the substrate SUB, and is doped with second conductivity type (e.g., an n-type) impurities. A plurality of insulating layers IL extending in the direction are sequentially provided in a third direction (e.g., a Z-direction) on the substrate SUB between two adjacent common source lines CSL. The insulating layers IL are spaced a predetermined distance apart in the third direction. The insulating layers IL may include an insulating material such as silicon oxide.

A plurality of pillars P penetrating through the insulating layers IL in the third direction are sequentially placed in the second direction on the substrate SUB between the two adjacent common source lines CSL. For example, the pillars P may penetrate through the insulating layers IL and contact the substrate SUB. In some additional detail, a surface layer S of each pillar P may include a silicon material having the first conductivity type and may function as a channel region. An inner layer I of each pillar P may include an insulating material such as silicon oxide or an air gap.

A charge storage layer CS is provided along the insulating layers IL, the pillars P, and an exposed surface of the substrate SUB in a region between the two adjacent common source lines CSL. The charge storage layer CS may include a gate insulating layer (or referred to as a "tunneling insulating layer"), a charge trap layer, and a blocking insulating layer. The charge storage layer CS may have an oxide-nitride-oxide (ONO) structure. A plurality of gate electrodes GE such as the selection lines GSL and SSL and the word lines WL1 through WL8 are provided on an exposed surface of the charge storage layer CS in the region between the two adjacent common source lines CSL.

Drains or drain contacts DR are respectively provided on the pillars P. The drains or drain contacts DR may include a silicon material doped with second conductivity type impurities. The bit lines BL1 through BL3 extending in a first direction (e.g., an X-direction) are placed on the drains DR spaced a predetermined distance apart in the second direction.

Figure 6:
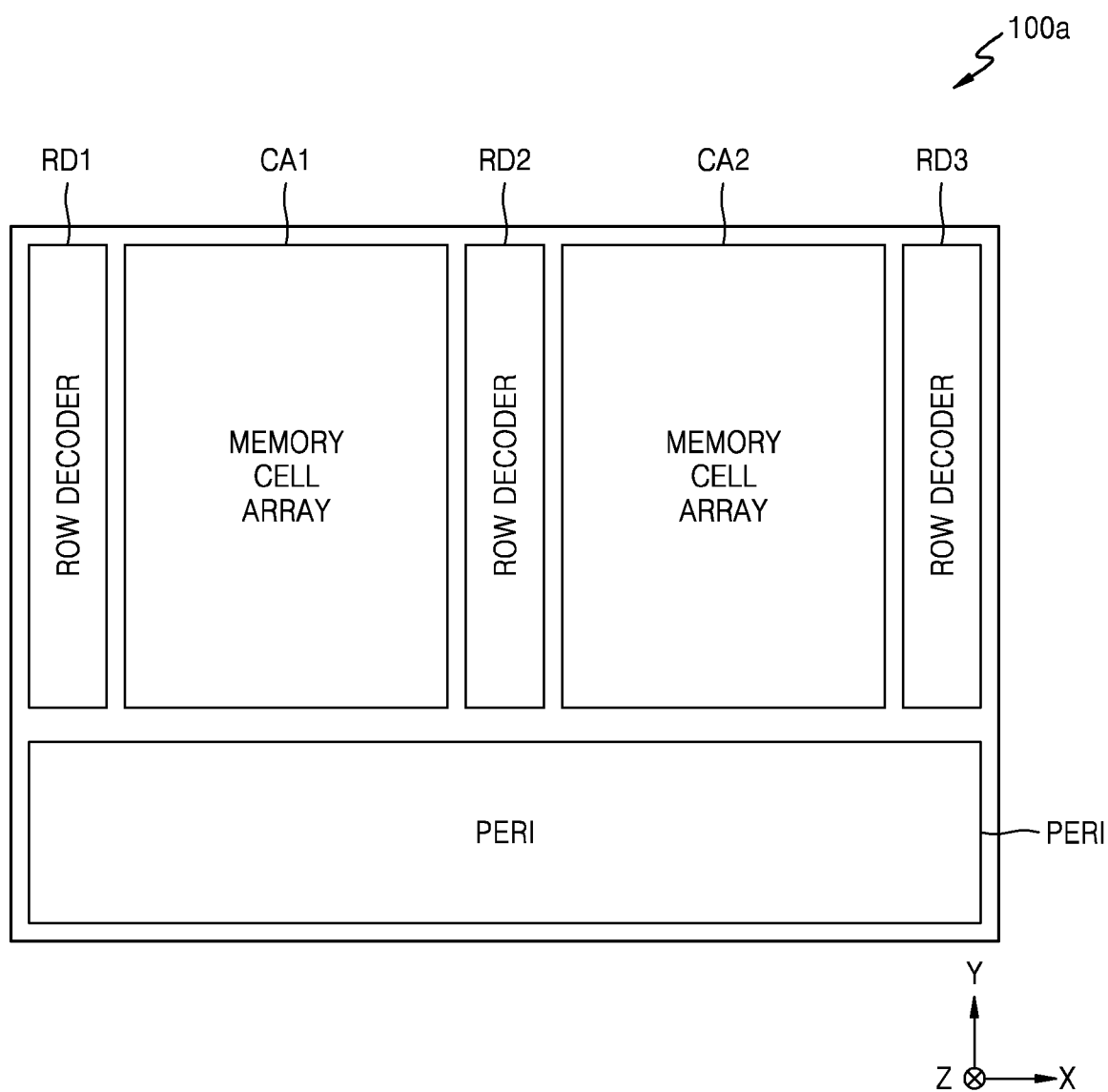
FIG. 6 is a layout diagram for explaining the placement of a row decoder included in a nonvolatile memory device, according to an embodiment of the inventive concept.

FIG. 6 is a layout diagram illustrating an exemplary placement of row decoders included in a nonvolatile memory device according to an embodiment of the inventive concept.

Referring to FIG. 6, a nonvolatile memory device 100a may be implemented in a semiconductor chip. The semiconductor chip may include memory cell array areas CA1 and CA2, row decoder areas RD1, RD2, and RD3, and a peripheral circuit area PERI. The row decoder areas RD1, RD2, and RD3 are adjacent to the memory cell array areas CA1 and CA2 in the first direction (e.g., an X-direction), such that row decoders may be placed in the row decoder areas RD1, RD2, and RD3. Accordingly, the memory cell array areas CA1 and CA2 and the row decoder areas RD1, RD2, and RD3 may be placed side by side in parallel with the main surface of a substrate.

The peripheral circuit area PERI is adjacent to the memory cell array areas CA1 and CA2 and the row decoder areas RD1, RD2, and RD3 in the second direction, i.e., the Y-direction. A page buffer, a data I/O circuit, etc. may be placed in the peripheral circuit area PERI.

Figure 7A:
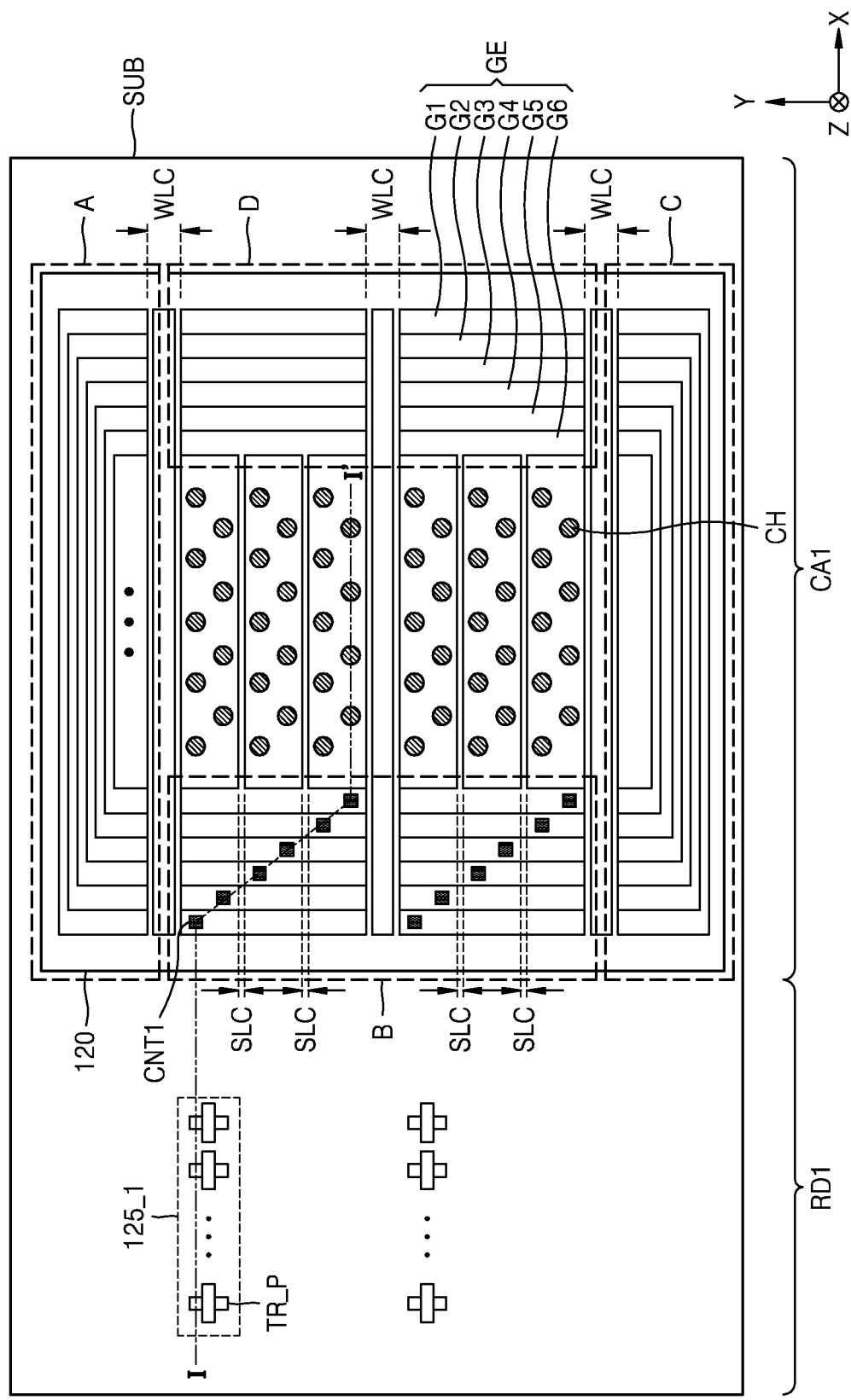
FIG. 7A is a layout diagram for explaining a partial memory cell array area and a partial row decoder area shown in FIG. 6.
Figure 7B:
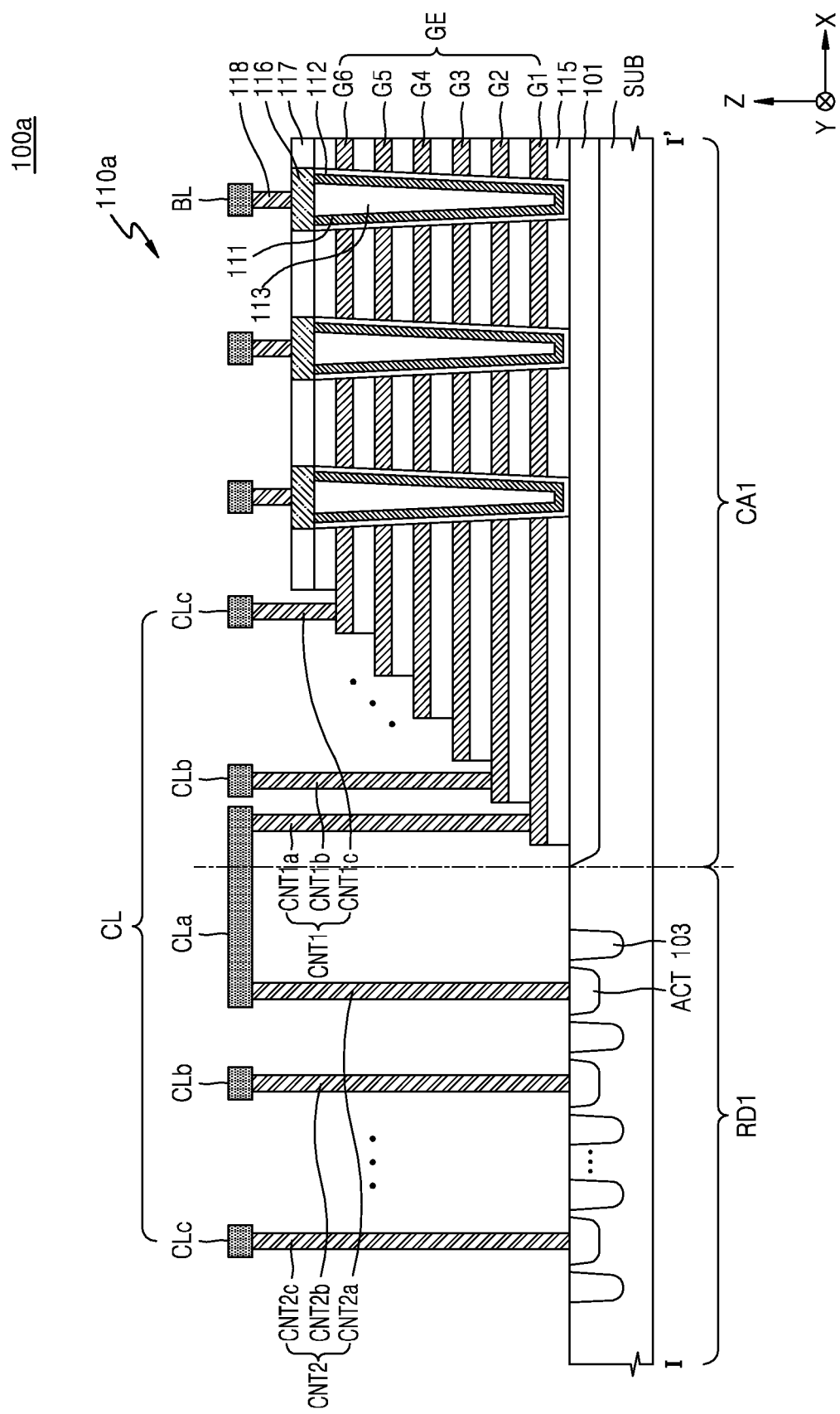
FIG. 7B is a cross-sectional view of the partial areas, taken along the line I-I' shown in FIG. 7A, according to an embodiment of the inventive concept.

FIG. 7A is a another layout diagram further illustrating a partial memory cell array area and a partial row decoder area of the nonvolatile memory device 100a of FIG. 6, and FIG. 7B is a cross-sectional view of these partial areas of FIG. 7A taken along the line I-I'.

Referring to FIGS. 7A and 7B, the nonvolatile memory device 100a may include the memory cell array area CA1 and the row decoder area RD1 that are formed on the substrate SUB.

Here, the substrate SUB has a "main surface" extending in first and second directions (e.g., arbitrary X- and Y-directions). In some embodiments, the substrate SUB may include Si, Ge, or SiGe. In other embodiments, the substrate SUB may include a polysilicon substrate, a silicon-on-insulator (SOI) substrate, or a germanium-on-insulator (GeOI) substrate.

A vertically stacked memory cell array 110a may be formed in the memory cell array area CA1 (i.e., the memory cell array 110s may have a vertically stacked structure). For example, a plurality of channel holes CH and a plurality of gate conductive layers GE may be formed on the substrate SUB to constitute the memory cell array 110. Here, the memory cell array 110 may have a circuit structure that is similar to that previously described in relation to FIG. 4.

A plurality of gate electrodes G1 through G6 respectively forming the gate conductive layers GE may be referred to as word lines, string selection lines, or ground selection lines. The gate electrodes G1 through G6 may be vertically stacked in the third direction (e.g., a Z-direction) perpendicular to the orientation of the main surface of the substrate SUB. As shown in FIG. 7B, a gate insulating layer 115 may be placed on a top or a bottom of each of the gate electrodes G1 through G6. The areas of the gate electrodes G1 through G6 may be decreased away from the substrate SUB. Accordingly, as shown in FIG. 7B, the outer region of the gate conductive layers GE may have a stair-stepped formation. A plurality of first contacts CNT1 may be respectively formed in the outer regions of the respective gate conductive layers GE. The gate electrodes G1 through G6 may be connected through the first contacts CNT1 to the pass transistor TR_P in a block selector 125_1 formed in the row decoder area RD1.

The gate conductive layers GE may be divided by a word line cut region WLC. A string selection line SSL among the gate conductive layers GE may be divided by a selection line cut region SLC.

Although the gate conductive layers GE include the six gate electrodes G1 through G6 in the embodiment shown in FIGS. 7A and 7B, this is just for convenience's sake in the description and the inventive concept is not limited thereto. The number of gate electrodes may vary with the structure of cell strings included in a memory cell array. For example, as shown in FIGS. 4 and 5, the gate conductive layers GE may include ten gate electrodes, and a nonvolatile memory device according to some embodiments of the inventive concept is not limited by the number of gate electrodes.

The channel holes CH may extend in the third direction penetrating the gate conductive layers GE and gate insulating layers 115. The bottom surface of each of the channel holes CH may contact the top surface of the substrate SUB. The channel holes CH may be arranged in the first direction and the second direction spaced apart at a predetermined distance. Each of the channel holes CH may include a channel layer 111, a gate insulating film 112, and a burying insulating film 113.

The channel layer 111 may extend in the third direction perpendicular to the top surface of a well region 101, penetrating through the gate conductive layers GE and the gate insulating layers 115. The bottom surface of the channel layer 111 may contact the top surface of the well region 101. The channel layer 111 may be arranged spaced apart at a predetermined distance in the first and second directions.

The channel layer 111 may include impurity-doped polysilicon or polysilicon not doped with impurities. The channel layer 111 may have a cup shape (or a cylinder shape with closed bottom) extending in a vertical direction. The inner side of the channel layer 111 may be filled with the burying insulating film 113. The top surface of the burying insulating film 113 may be at the same level as the top surface of the channel layer 111. Alternatively, the channel layer 111 may have a pillar shape, and at this time the burying insulating film 113 may not be formed.

The gate insulating film 112 may be between the channel layer 111 and the gate conductive layers GE. Selectively, a barrier metal layer may also be formed between the gate insulating film 112 and the gate conductive layers GE.

A drain region 116 may be formed on the channel layer 111 and the gate insulating film 112. The drain region 116 may include impurity-doped polysilicon.

An etch stop layer 117 may be formed on a side wall of the drain region 116. The top surface of the etch stop layer 117 may be at the same level as the top surface of the drain region 116. The etch stop layer 117 may include an insulating material such as silicon nitride or silicon oxide.

A bit line contact 118 may be formed on the drain region 116. A bit line BL may be formed on the bit line contact 118. The bit line BL may extend in the second direction. A plurality of channel layers 111 arranged in the second direction may be electrically connected to the bit line BL.

The gate conductive layers GE may form a plurality of first through fourth edge regions A, B, C, and D. A stepped pad structure may be formed in each of the first through fourth edge regions A, B, C, and D. The stepped pad structure may be referred to as a pad-line-pad. A plurality of the first contacts CNT1 may be formed in at least one edge region, e.g., the second edge region B, among the first through fourth edge regions A, B, C, and D. The gate conductive layers GE may be respectively connected to a plurality of wiring lines CL through the first contacts CNT1 and may be respectively connected to pass transistors TR_P of the block selector 125_1 through the wiring lines CL. At least one wiring line CL among the wiring lines CL may have a different implementation or layout (hereafter, generally "shape") than the shape of other wiring lines CL and thus have reduced resistance as the result of this difference.

Figure 10A:
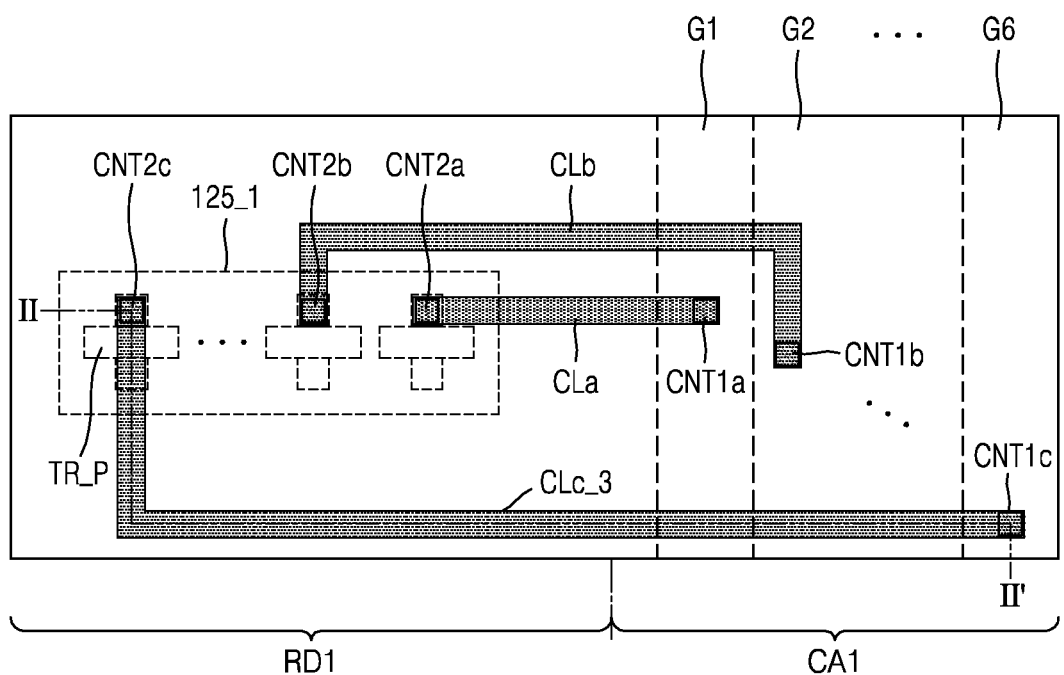
FIG. 10A is a layout diagram for explaining wiring lines shown in FIG. 7B, according to another embodiment of the inventive concept.
Figure 10B:
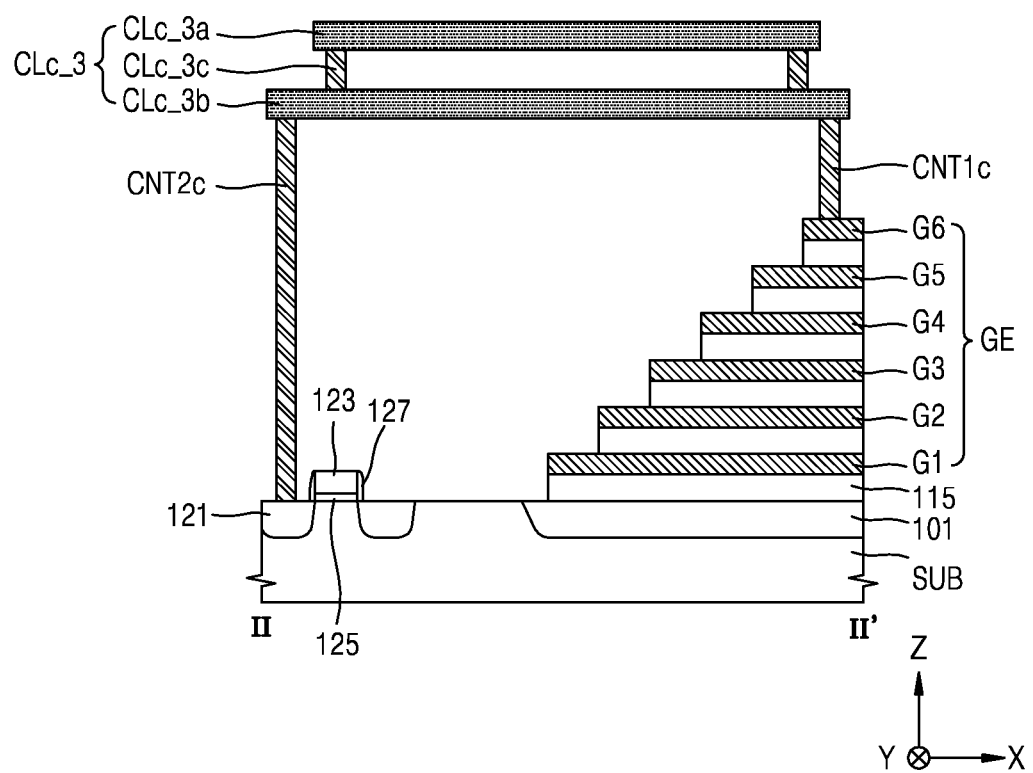
FIG. 10B is a cross-sectional view of the layout, taken along the line II-IF shown in FIG. 10A.

Each of the pass transistors TR_P may include a gate (e.g., 123 in FIG. 10B), a gate insulating film (e.g., 125 in FIG. 10B), and a source/drain region (e.g., 121 in FIG. 10B). Each of opposite side walls of the gate 123 may be covered with an insulating spacer (e.g., 127 in FIG. 10B).

An active region ACT may be defined by an isolation layer 103 in the row decoder area RD1 of the substrate SUB. A P-type well and an N-type well for a row decoder may be formed in the active region ACT, and metal oxide semiconductor (MOS) transistors may be respectively formed on the P-type well and the N-type well. The active region ACT may form a source/drain region of each pass transistor TR_P.

Each of the wiring lines CL may be connected to the active region ACT of the row decoder area RD1 through a corresponding one among a plurality of second contacts CNT2 and connected to the source/drain region of the pass transistor TR_P.

A plurality of the wiring lines CL and a plurality of the second contacts CNT2 may include a metal material such as W, Au, Ag, Cu, Al, TiAlN, WN, Ir, Pt, Pd, Ru, Zr, Rh, Ni, Co, Cr, Sn, or Zn. The first contacts CNT1 and the second contacts CNT2 may also include a barrier metal film.

A plurality of the wiring lines CL may include a material different from the metal included in the first contacts CNT1 and the second contacts CNT2. For example, the wiring lines CL may include a material having lower resistance than the metal included in the first contacts CNT1.

Figure 8:
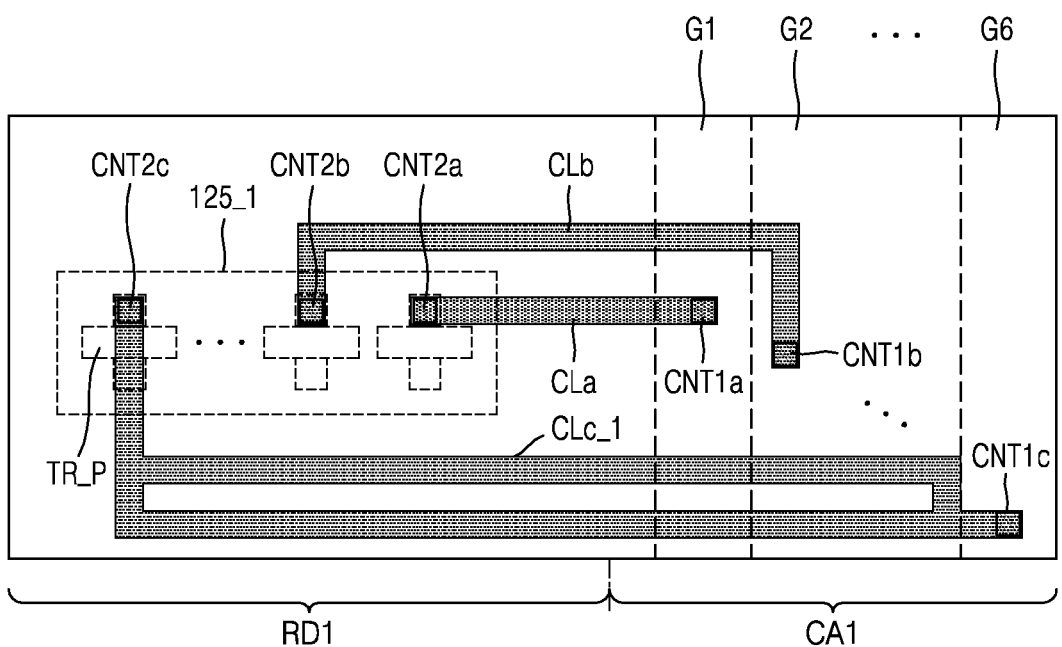
FIG. 8 is a layout diagram for explaining wiring lines shown in FIG. 7B, according to an embodiment of the inventive concept.

FIG. 8 is a layout diagram illustrating one possible wiring arrangement that may be used to implement the nonvolatile memory device 100a of FIGS. 7A and 7B according to an embodiment of the inventive concept. In this regard, FIG. 8 shows only a selected portion of the nonvolatile memory device 100a of FIG. 7A.

Referring to FIGS. 7A, 7B and 8, the block selector 125_1 may include a plurality of pass transistors TR_P, where each pass transistors TR_P may be respectively connected to gate conductive layers (e.g., G1 through G6 in FIG. 7B) in the memory cell array area CA1. For example, the pass transistors TR_P may be respectively connected to the gate conductive layers G1 through G6 through a plurality of first contacts CNT1a, CNT1b, and CNT1c, a plurality of wiring lines CLa, CLb, and CLc_1, and a plurality of second contacts CNT2a, CNT2b, and CNT2c.

The wiring lines CLa, CLb, and CLc_1 may be formed at the same level with respect to the substrate (e.g., SUB in FIG. 7B), where the term "level" is used here to denote a height (e.g., the third direction) perpendicular to the substrate SUB.

The wiring lines CLa, CLb, and CLc_1 may respectively include conductive lines having the same width. That is, at least one wiring line (e.g., CLc_1) among the wiring lines CLa, CLb, and CLc_1 may include a plurality of conductive lines that are connected in parallel and have the same width. Hence, the total resistance of the wiring line CLc_1 including a plurality of conductive lines connected in parallel may be reduced.

In some embodiments, a wiring line including a plurality of conductive lines among a plurality of wiring lines may be determined based on a resistance value of each of the gate conductive layers G1 through G6 respectively connected to the wiring lines. For example, a wiring line connected to a gate conductive layer having the highest resistance among the gate conductive layers G1 through G6 stacked on one another may include a plurality of conductive lines.

As shown in FIG. 7B, the shape of each channel hole CH has a width that decreases as it descends to lower layer(s). Accordingly, the gate conductive layer G6 at the top among the stacked gate conductive layers G1 through G6 respectively connected to the first contacts CNT1a, CNT1b, and CNT1c may have a relatively high resistance. In this case, the wiring line CLc_1 connected to the gate conductive layer G6 at the top may include a plurality of conductive lines connected in parallel. However, the inventive concept is not limited thereto, and another gate conductive layer among the gate conductive layers G1 through G6 instead of the gate conductive layer G6 (the top most layer) may have highest resistance, and therefore, a wiring line connected to the gate conductive layer having the highest resistance may include a plurality of conductive lines.

The illustrated embodiment of FIG. 8 is not limited to of at least one wiring line CLc_1 including a plurality of conductive lines that are connected in parallel and having the same width. For example, the at least one wiring line CLc_1 may include a plurality of conductive lines connected in parallel and having different widths.

Transmission of row line voltages to the gate conductive layers G1 through G6 may be controlled by a switching operation of the pass transistors TR_P included in the block selector 125_1. Each row line among a plurality of row lines (e.g., SSL, WL1 through WLn, and GSL in FIG. 2) connecting the pass transistors TR_P to a cell block (e.g., 111 in FIG. 2) includes a first contact, a wiring line, and a second contact, and therefore, the resistance of at least one row line may decrease when the resistance of at least one wiring line decreases.

Figure 9:
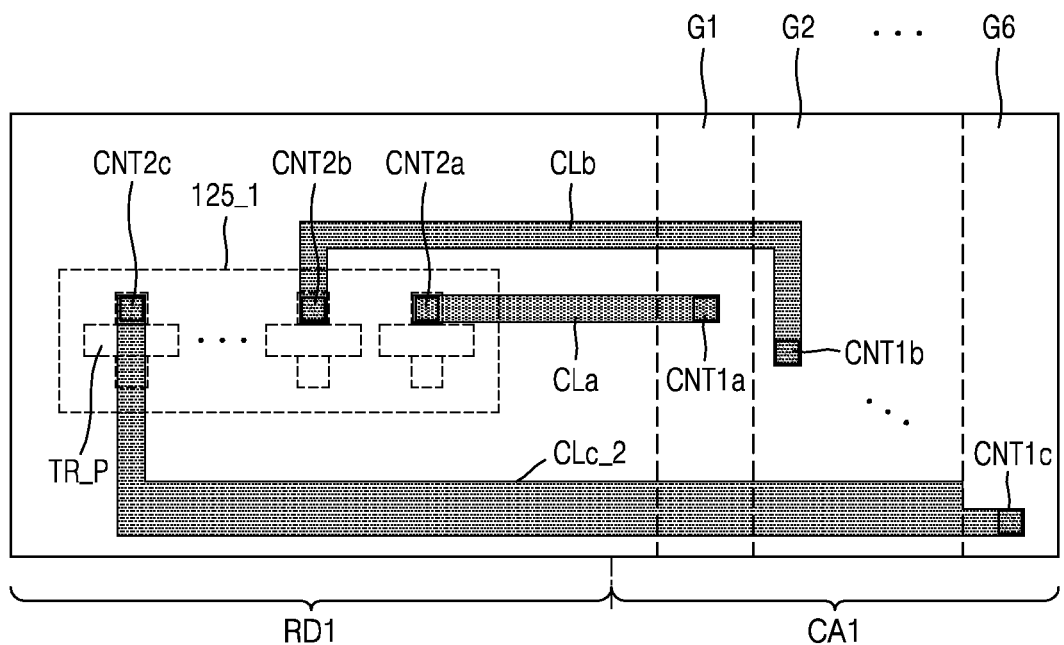
FIG. 9 is a layout diagram for explaining wiring lines shown in FIG. 7B, according to another embodiment of the inventive concept.

FIG. 9 is a another layout diagram further illustrating wiring lines (or a wiring arrangement) that may be used to implement the nonvolatile memory device 100a of FIGS. 7A and 7B according to another embodiment of the inventive concept. Like FIG. 8, FIG. 9 shows only a relevant portion of the nonvolatile memory device 100a.

Referring to FIGS. 7A, 7B, 8 and 9, a plurality of the pass transistors TR_P may be respectively connected to the gate conductive layers G1 through G6 through a plurality of the first contacts CNT1a, CNT1b, and CNT1c, a plurality of wiring lines CLa, CLb, and CLc_2, and a plurality of the second contacts CNT2a, CNT2b, and CNT2c. The wiring lines CLa, CLb, and CLc_2 may be formed at the same level from a substrate (e.g., SUB in FIG. 7B).

Here, at least one wiring line (e.g., CLc_2) among the wiring lines CLa, CLb, and CLc_2 may include a conductive line having a greater width than some other wiring lines (e.g., CLa and CLb) among the wiring lines CLa, CLb, and CLc_2. Accordingly, the total resistance of the at least one wiring line CLc_2 may be reduced. Here, it is assumed that the other wiring lines CLa and CLb may respectively include conductive lines having the same width.

However, in some embodiments, a wiring line including a conductive line having a relatively greater width among the wiring lines CLa, CLb, and CLc_2 may be determined based on a resistance value of each of the gate conductive layers G1 through G6 respectively connected to the wiring lines CLa, CLb, and CLc_2. For example, a wiring line connected to a gate conductive layer having the highest resistance among the gate conductive layers G1 through G6 stacked on one another may include a conductive line having a relatively greater width. In some embodiment, the wiring line CLc_2 connected to the gate conductive layer G6 at the top among the stacked gate conductive layers G1 through G6 may include a conductive line having a relatively greater width.

FIG. 10A is a still another layout diagram illustrating wiring lines that may be used to implement the memory device 100a of FIGS. 7A and 7B according to another embodiment of the inventive concept, and FIG. 10B is a cross-sectional view of the layout of FIG. 10A taken along the line II-II'.

Referring to FIGS. 7A, 7B, 10A and 10B, a plurality of the pass transistors TR_P may be respectively connected to the gate conductive layers G1 through G6 through a plurality of the first contacts CNT1a, CNT1b, and CNT1c, a plurality of wiring lines CLa, CLb, and CLc_3, and a plurality of the second contacts CNT2a, CNT2b, and CNT2c.

Here, at least one wiring line (e.g., CLc_3) among the wiring lines CLa, CLb, and CLc_3 may include conductive lines CLc_3a and CLc_3b formed at different levels. The conductive lines CLc_3a and CLc_3b formed at different levels may be connected to each other through a via structure CLc_3c penetrating through an insulating layer between the conductive lines CLc_3a and CLc_3b. Accordingly, the total resistance of the at least one wiring line CLc_3 may be reduced. Here, some other wiring lines CLa and CLb among the wiring lines CLa, CLb, and CLc_3 may have the same width and be formed at the same level.

However, in some embodiments, among the wiring lines CLa, CLb, and CLc_3, a wiring line including a plurality of conductive lines formed at different levels may be determined based on a resistance value of each of the gate conductive layers G1 through G6 respectively connected to the wiring lines CLa, CLb, and CLc_3. For example, a wiring line connected to a gate conductive layer having the highest resistance among the gate conductive layers G1 through G6 stacked on one another may include a plurality of conductive lines formed at different levels. In some embodiment, the wiring line CLc_3 connected to the gate conductive layer G6 at the top among the stacked gate conductive layers G1 through G6 may include the conductive lines CLc_3a and CLc_3b formed at different levels.

According to some embodiments illustrated the foregoing embodiment, inclusive of FIGS. 7A, 7B, 8, 9, 10A and 10B, a nonvolatile memory device may be configured such that the resistance of some row lines connecting a plurality of pass transistors TR_P to a cell block (e.g., 111 in FIG. 2) is selectively reduced.

Figure 11A:
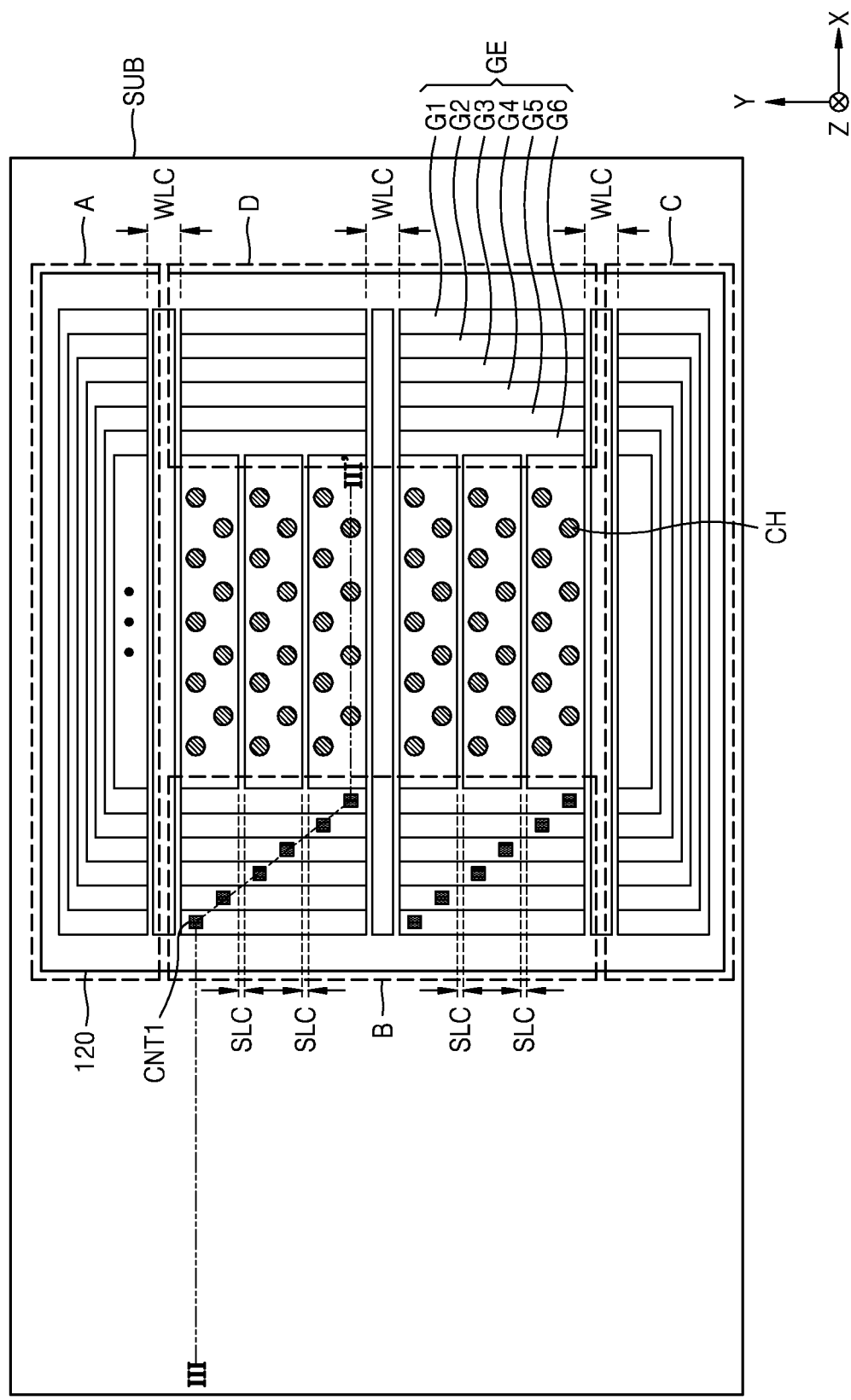
FIG. 11A is a layout diagram of a nonvolatile memory device according to another embodiment of the inventive concept.
Figure 11B:
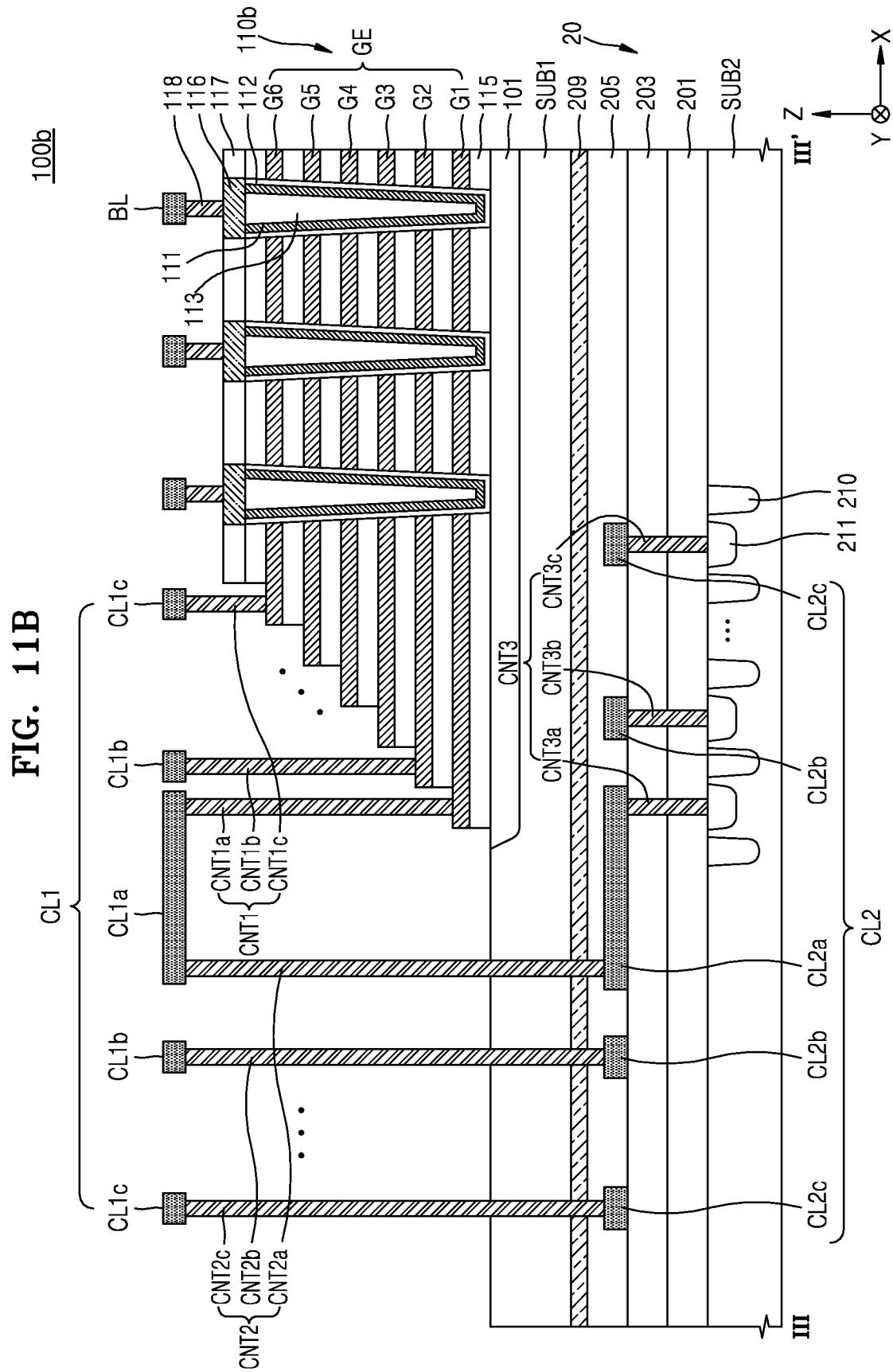
FIG. 11B is a cross-sectional view of the nonvolatile memory device, taken along the line shown in FIG. 11A, according to an embodiment of the inventive concept.

FIG. 11A is a layout diagram illustrating a nonvolatile memory device 100b according to another embodiment of the inventive concept, and FIG. 11B is a cross-sectional view of the nonvolatile memory device 100b taken along the line.

In the nonvolatile memory device 100b, a memory cell array 110b may be formed on (or over) a peripheral circuit area 20, where that the resulting circuit structure of the nonvolatile memory device 100b may be referred to as a cell over peripheral (COP) circuit structure.

Referring to FIGS. 11A and 11B, the nonvolatile memory device 100b may include the peripheral circuit area 20 formed at a first level on a substrate SUB2, a first semiconductor layer SUB1, and the memory cell array 110b formed at a second level on the substrate SUB2. The nonvolatile memory device 100b may also include an insulating thin film 209 between the peripheral circuit area 20 and the first semiconductor layer SUB1.

The peripheral circuit area 20 may include a page buffer, a latch circuit, a cache circuit, a column decoder, a row decoder, a sense amplifier, or a data in/out circuit.

The memory cell array 110b may have the circuit structure as shown in FIG. 4.

Here, the term "level" is used to denote a height from the substrate SUB2 in the vertical direction, where the first level is closer to the substrate SUB2 than the second level.

In some embodiments, the substrate SUB2 may have a main surface extending in the first and second directions. The substrate SUB2 may include Si, Ge, or SiGe. In other embodiments, the substrate SUB2 may include a SOI substrate or a GeOI substrate.

In the substrate SUB2, an active region may be defined by an isolation layer 210. A P-type well and an N-type well for a peripheral circuit may be formed in the active region 211 in the substrate SUB2. MOS transistors may be respectively formed on the P-type well and the N-type well. For example, a plurality of pass transistors (e.g., TR_P in FIG. 2) may be formed. Each of the pass transistors may include a gate, a gate insulating film, and a source/drain region.

A plurality of interlayer insulating films 201, 203, and 205 may be sequentially stacked on the substrate SUB2. The interlayer insulating films 201, 203, and 205 may include silicon oxide or silicon oxy-nitride.

The peripheral circuit area 20 may include a plurality of pass transistors. The pass transistors may be electrically connected to a plurality of second wiring lines CL2 and third contacts CNT3 formed in the peripheral circuit area 20. The second wiring lines CL2 and the third contacts CNT3 may be insulated from one another by the interlayer insulating films 201, 203, and 205.

In some embodiments, a plurality of first wiring lines CL1 and the second wiring lines CL2 may include a metal, conductive metal nitride, metal silicide, or a combination thereof. For example, the second wiring lines CL2 may include a conductive material such as tungsten, molybdenum, titanium, cobalt, tantalum, nickel, tungsten silicide, titanium silicide, cobalt silicide, tantalum silicide, or nickel silicide.

Although the second wiring lines CL2 have a single-layer wiring structure in the current embodiment, the inventive concept is not limited thereto. For example, the second wiring lines CL2 may be formed across a plurality of layers in a multi-layer structure.

The first semiconductor layer SUB1 may function as a substrate on which vertical memory cells are to be formed. In some embodiments, the first semiconductor layer SUB1 may include impurity-doped polysilicon. For example, the first semiconductor layer SUB1 may include p-type impurity-doped polysilicon. The first semiconductor layer SUB1 may be formed to a height of about 20 to 500 nm but is not limited thereto.

The memory cell array 110b may be formed on the first semiconductor layer SUB1. The structure of the memory cell array 110b shown in FIG. 10B may be substantially the same as that of a memory cell array 110a shown in FIGS. 7A and 7B.

The gate conductive layers GE may form a plurality of the first through fourth edge regions A, B, C and D. A stepped pad structure may be formed in each of the first through fourth edge regions A, B, C and D. For example, a plurality of the first contacts CNT1 may be formed in the second edge region 100b.

The gate conductive layers GE may be connected to respective active regions 211 in the substrate SUB2, in which a source/drain region of a pass transistor is formed, through a plurality of the first contacts CNT1, a plurality of the first wiring lines CL1, a plurality of the second contacts CNT2, a plurality of the second wiring lines CL2, and a plurality of the third contacts CNT3.

The descriptions of the first contacts CNT1 and the wiring lines CL shown in FIGS. 7A and 7B may be applied to the first contacts CNT1 and the first wiring lines CL1. Accordingly, the descriptions of some wiring lines CLc_1, CLc_2, and CLc_3 respectively shown in FIGS. 8 through 10A may be applied to at least one wiring line (e.g., CL1c) among the first wiring lines CL1.

Figure 12:
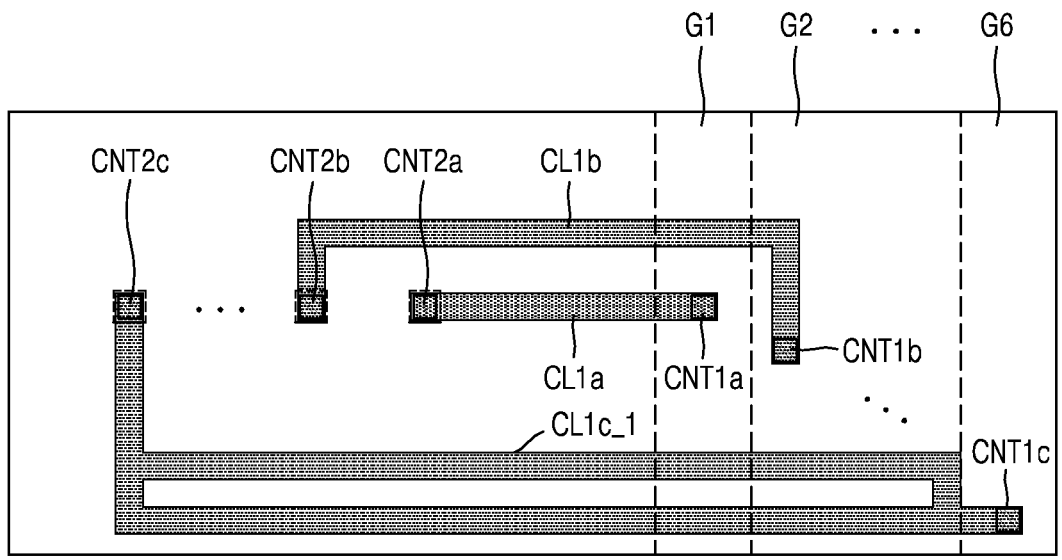
FIG. 12 is a layout diagram for explaining first wiring lines shown in FIG. 11B, according to an embodiment of the inventive concept.
Figure 13:
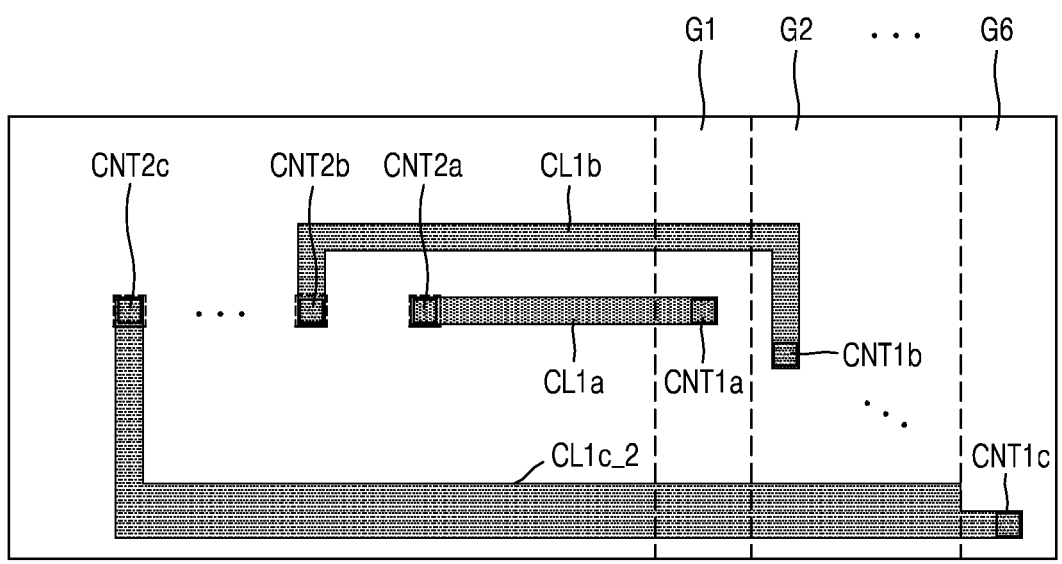
FIG. 13 is a layout diagram for explaining first wiring lines shown in FIG. 11B, according to another embodiment of the inventive concept.
Figure 14A:
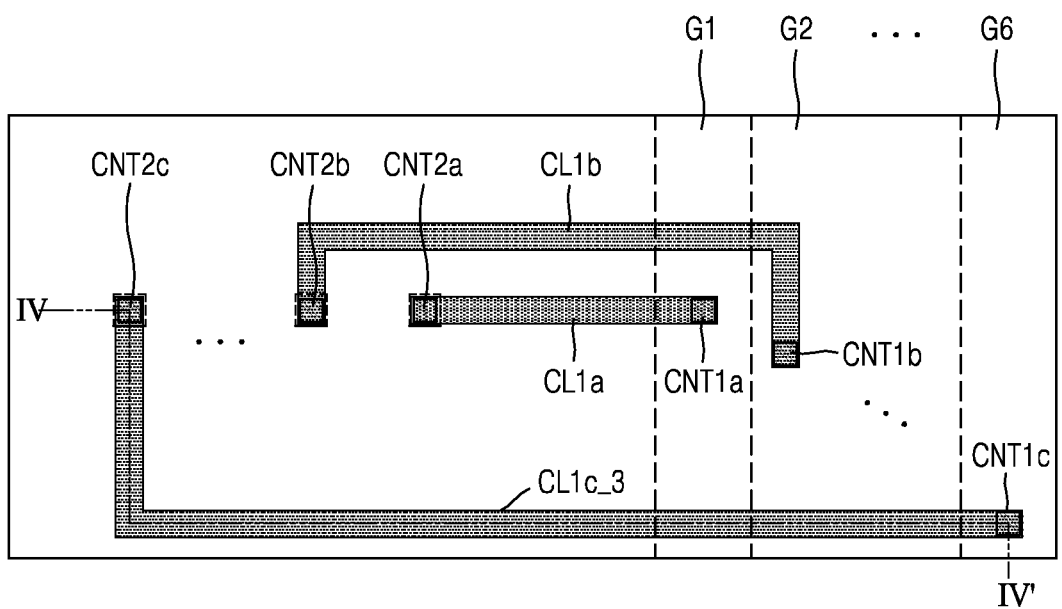
FIG. 14A is a layout diagram for explaining first wiring lines shown in FIG. 11B, according to another embodiment of the inventive concept.
Figure 14B:
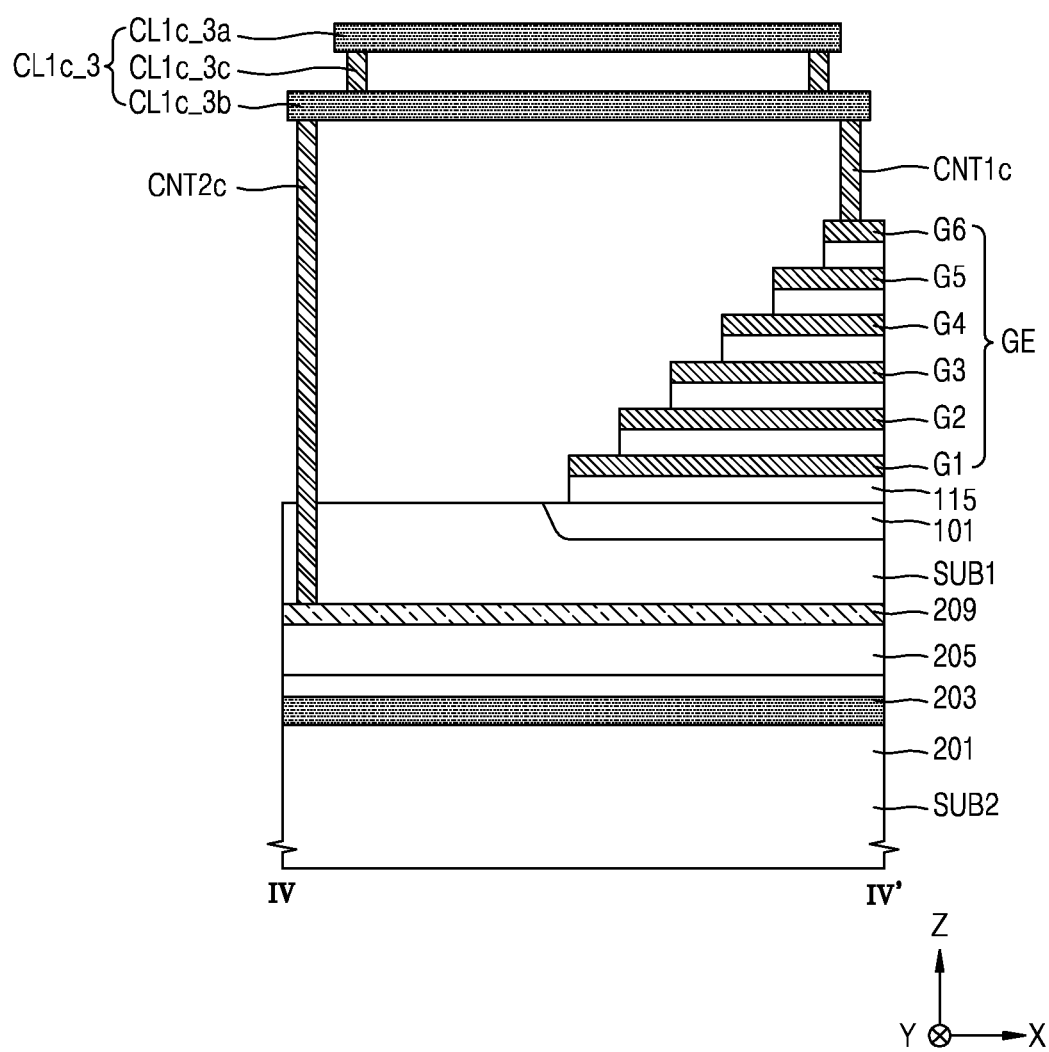
FIG. 14B is a cross-sectional view of the layout, taken along the line IV-IV' shown in FIG. 14A.

FIGS. 12, 13 and 14A are layout diagrams further illustrating the first wiring lines shown in FIG. 11B according to embodiments of the inventive concept. FIG. 14B is a cross-sectional view of FIG. 14A taken along the line IV-IV.

Referring to FIG. 12, a plurality of first wiring lines CL1a, CL1b, and CL1c_1 may be formed at the same level from a substrate (e.g., SUB1 in FIG. 11B). The first wiring lines CL1a, CL1b, and CL1c_1 may respectively include conductive lines having the same width. Here, at least one first wiring line (e.g., CL1c_1) among the first wiring lines CL1a, CL1b, and CL1c_1 may include a plurality of conductive lines which are connected in parallel and have the same width. The total resistance of the first wiring line CL1c_1 including a plurality of conductive lines connected in parallel may be reduced.

In some embodiments, a first wiring line (e.g., CL1c_1) including a plurality of conductive lines among a plurality of the first wiring lines CL1a, CL1b, and CL1c_1 may be determined based on a resistance value of each of the gate conductive layers G1 through G6 respectively connected to the first wiring lines CL1a, CL1b, and CL1c_1. For example, a first wiring line connected to a gate conductive layer having the highest resistance among the gate conductive layers G1 through G6 stacked on one another may include a plurality of conductive lines.

As shown in FIG. 11B, the shape of each channel hole CH has a width decreasing towards a lower layer. Accordingly, the gate conductive layer G6 at the top among the gate conductive layers G1 through G6 respectively connected to the first contacts CNT1a, CNT1b, and CNT1c may have high resistance. In this case, the first wiring line CL1c_1 connected to the gate conductive layer G6 at the top may include a plurality of conductive lines connected in parallel.

Referring to FIG. 13, at least one wiring line (e.g., CL1c_2) among a plurality of first wiring lines CL1a, CL1b, and CL1c_2 may include a conductive line having a greater width than some other wiring lines (e.g., CL1a and CL1b) among the first wiring lines CLa, CLb, and CLc_2. Accordingly, the total resistance of the at least one first wiring line CL1c_2 may decrease. The other first wiring lines CL1a and CL1b may respectively include conductive lines having the same width.

In some embodiments, a first wiring line including a conductive line having a relatively greater width among the first wiring lines CL1a, CL1b, and CL1c_2 may be determined based on a resistance value of each of the gate conductive layers G1 through G6 respectively connected to the first wiring lines CL1a, CL1b, and CL1c_2. For example, a first wiring line connected to a gate conductive layer having the highest resistance among the gate conductive layers G1 through G6 stacked on one another may include a conductive line having a relatively greater width.

Referring to FIGS. 14A and 14B, at least one wiring line (e.g., CL1c_3) among a plurality of first wiring lines CL1a, CL1b, and CL1c_3 may include conductive lines CL1c_3a and CL1c_3b formed at different levels. The conductive lines CL1c_3a and CL1c_3b formed at different levels may be connected to each other through a via structure CL1c_3c penetrating through an insulating layer between the conductive lines CL1c_3a and CL1c_3b. Accordingly, the total resistance of the at least one wiring line CL1c_3 may be reduced. Here, some other first wiring lines CL1a and CL1b among the first wiring lines CL1a, CL1b, and CL1c_3 may have the same width and formed at the same level.

In some embodiments, among the first wiring lines CL1a, CL1b, and CL1c_3, a first wiring line (e.g., CL1c_3) including a plurality of conductive lines formed at different levels may be determined based on a resistance value of each of the gate conductive layers G1 through G6 respectively connected to the first wiring lines CL1a, CL1b, and CL1c_3. For example, a first wiring line connected to a gate conductive layer having the highest resistance among the gate conductive layers G1 through G6 vertically stacked on one another may include a plurality of conductive lines.

Referring to FIGS. 11B, 12, 13, 14A and 14B, the first wiring lines CL1 may include at least one wiring line among the first wiring line CL1c_1 shown in FIG. 12, the first wiring line CL1c_2 shown in FIG. 13, and the first wiring line CL1c_3 shown in FIG. 14B. Therefore, according to some embodiments of the inventive concept, a memory device may be manufactured taking into account process environments or placement of wiring lines and may be configured to decrease the resistance of some row lines connecting a plurality of pass transistors and a memory cell array, which are formed in a peripheral circuit area.

Figure 15:
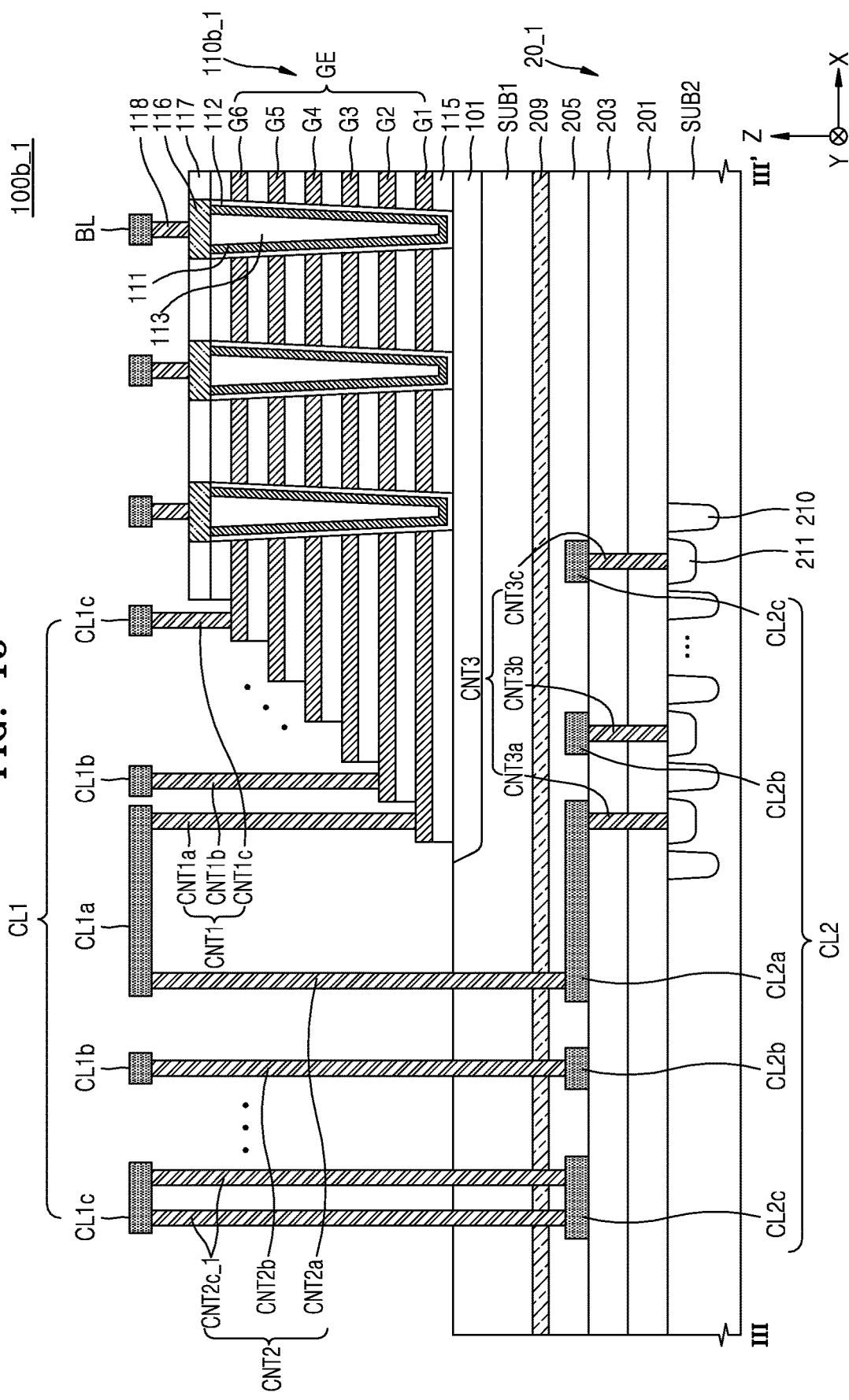
FIG. 15 is a layout diagram of a nonvolatile memory device according to a further embodiment of the inventive concept.

FIG. 15 is a layout diagram illustrating a nonvolatile memory device 100b_1 according to a another embodiment of the inventive concept. Comparative reference may be made to FIG. 11B.

Referring to FIG. 15, in a memory cell array 110b_1 of the nonvolatile memory device 100b_1, a plurality of the gate conductive layers GE may be connected to respective active regions 211 in the substrate SUB2, in which a source/drain region of a pass transistor is formed, through a plurality of the first contacts CNT1, a plurality of the first wiring lines CL1, a plurality of second contacts CNT2_1, a plurality of the second wiring lines CL2, and a plurality of the third contacts CNT3.

In some embodiments, at least one second contact CNT2c_1 among the second contacts CNT2_1 may include a plurality of contact plugs, which may penetrate through the first semiconductor layer SUB1, the insulating thin film 209, and the interlayer insulating film 205 to connect the first wiring line CL1c to the second wiring line CL2c. Accordingly, the total resistance of the at least one second contact CNT2c_1 may be reduced.

In some embodiments, a second contact including a plurality of contact plugs among the second contacts CNT2_1 may be determined based on a resistance value of each of the gate conductive layers G1 through G6 respectively connected to the second contacts CNT2_1. For example, a second contact connected to a gate conductive layer having the highest resistance among the gate conductive layers G1 through G6 stacked on one another may include a plurality of contact plugs. In some embodiments, the second contact CNT2c_1 connected to the gate conductive layer G6 at the top among the gate conductive layers G1 through G6 may include a plurality of contact plugs.

According to some embodiments of the inventive concept, the nonvolatile memory device 100b_1 may be configured to reduce the resistance of some row lines connecting a plurality of pass transistors formed in a peripheral circuit area 20_1 and the memory cell array 110b_1.

Figure 16:
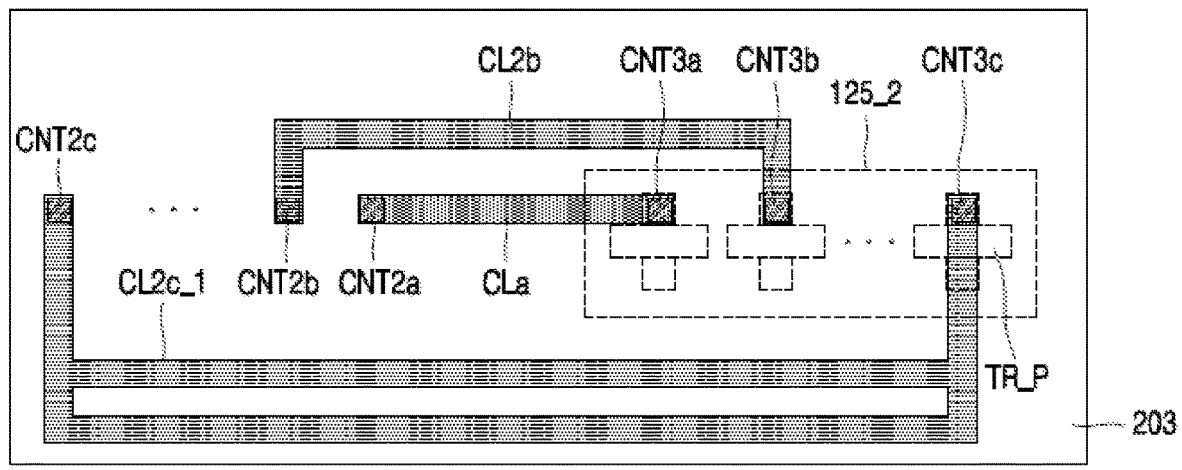
FIG. 16 is a layout diagram for explaining second wiring lines shown in FIG. 11B, according to another embodiment of the inventive concept.

FIG. 16 is a layout diagram further illustrating the second wiring lines that may be used to implement the nonvolatile memory device 100b of FIG. 11B according to another embodiment of the inventive concept. Here, the second wiring lines are formed on the interlayer insulating film 203.

Referring to FIG. 16, a plurality of the pass transistors TR_P may be respectively connected to a plurality of gate conductive layers (e.g., G1 through G6 in FIG. 11B) through a plurality of the first contacts CNT1a, CNT1b, and CNT1c, a plurality of the first wiring lines CL1a, CL1b, and CL1c, a plurality of the second contacts CNT2a, CNT2b, and CNT2c, a plurality of second wiring lines CL2a, CL2b, and CL2c_1, and a plurality of third contacts CNT3a, CNT3b, and CNT3c.

The second wiring lines CL2a, CL2b, and CL2c_1 may be formed at the same level from a substrate (e.g., SUB2 in FIG. 11B), i.e., on the interlayer insulating film 203. The second wiring lines CL2a, CL2b, and CL2c_1 may respectively include conductive lines having the same width. At this time, at least one wiring line (e.g., CL2c_1) among the second wiring lines CL2a, CL2b, and CL2c_1 may include a plurality of conductive lines which are connected in parallel and have the same width. The total resistance of the second wiring line CL2c_1 including a plurality of conductive lines connected in parallel other may be reduced.

In some embodiments, a second wiring line including a plurality of conductive lines among the second wiring lines CL2a, CL2b, and CL2c_1 may be determined based on a resistance value of each of the gate conductive layers G1 through G6 respectively connected to the second wiring lines CL2a, CL2b, and CL2c_1. For example, a second wiring line connected to a gate conductive layer having the highest resistance among the gate conductive layers G1 through G6 stacked on one another may include a plurality of conductive lines. In some embodiments, the second wiring line CL2c_1 connected to the gate conductive layer G6 at the top among the gate conductive layers G1 through G6 may include a plurality of conductive lines connected in parallel.

The current embodiment is not limited to the fact that the at least one wiring line CL2c_1 includes a plurality of conductive lines which are connected in parallel and have the same width. The at least one wiring line CL2c_1 may include a plurality of conductive lines which are connected in parallel and have different widths.

Figure 17:
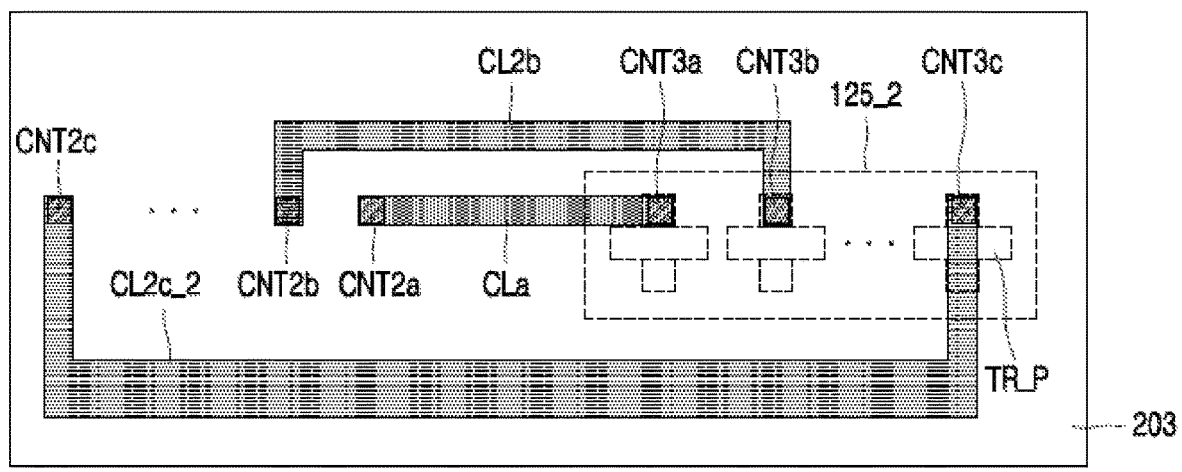
FIG. 17 is a layout diagram for explaining second wiring lines shown in FIG. 11B, according to another embodiment of the inventive concept.

FIG. 17 is a layout diagram further illustrating the second wiring lines shown in FIG. 11B according to another embodiment of the inventive concept.

Referring to FIG. 17 with comparative reference to FIG. 16, a plurality of the pass transistors TR_P may be respectively connected to a plurality of gate conductive layers (e.g., G1 through G6 in FIG. 11B) through a plurality of the first contacts CNT1a, CNT1b, and CNT1c, a plurality of the first wiring lines CL1a, CL1b, and CL1c, a plurality of the second contacts CNT2a, CNT2b, and CNT2c, a plurality of second wiring lines CL2a, CL2b, and CL2c_2, and a plurality of the third contacts CNT3a, CNT3b, and CNT3c. The second wiring lines CL2a, CL2b, and CL2c_2 may be formed at the same level from a substrate (e.g., SUB2 in FIG. 11B).

Here, at least one second wiring line (e.g., CL2c_2) among the second wiring lines CL2a, CL2b, and CL2c_2 may include a conductive line having a greater width than some other second wiring lines (e.g., CL2a and CL2b) among the second wiring lines CL2a, CL2b, and CL2c_2. Accordingly, the total resistance of the at least one second wiring line CL2c_2 may be reduced as compared with that of the other second wiring lines CL2a and CL2b. The other second wiring lines CL2a and CL2b may respectively include conductive lines having the same width.

In some embodiments, a second wiring line including a conductive line having a relatively wider width among the second wiring lines CL2a, CL2b, and CL2c_2 may be determined based on a resistance value of each of the gate conductive layers G1 through G6 respectively connected to the second wiring lines CL2a, CL2b, and CL2c_2. For example, a second wiring line connected to a gate conductive layer having a highest resistance among the gate conductive layers G1 through G6 vertically stacked on one another may include a conductive line having a relatively wider (or greater) width. In some embodiment, the second wiring line CL2c_2 connected to the gate conductive layer G6 at the top among the gate conductive layers G1 through G6 may include a conductive line having this wider width.

Figure 18A:
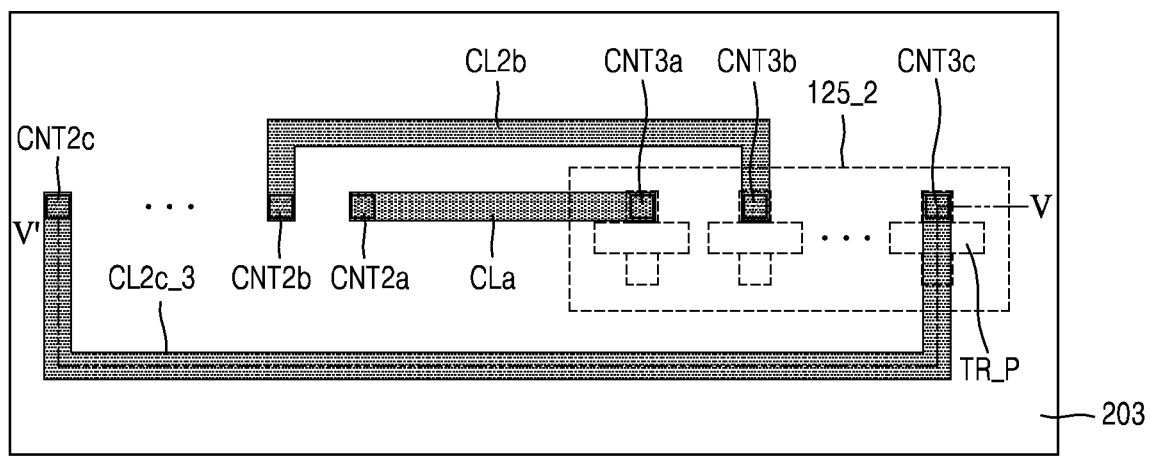
FIG. 18A is a layout diagram for explaining second wiring lines shown in FIG. 11B, according to another embodiment of the inventive concept.
Figure 18B:
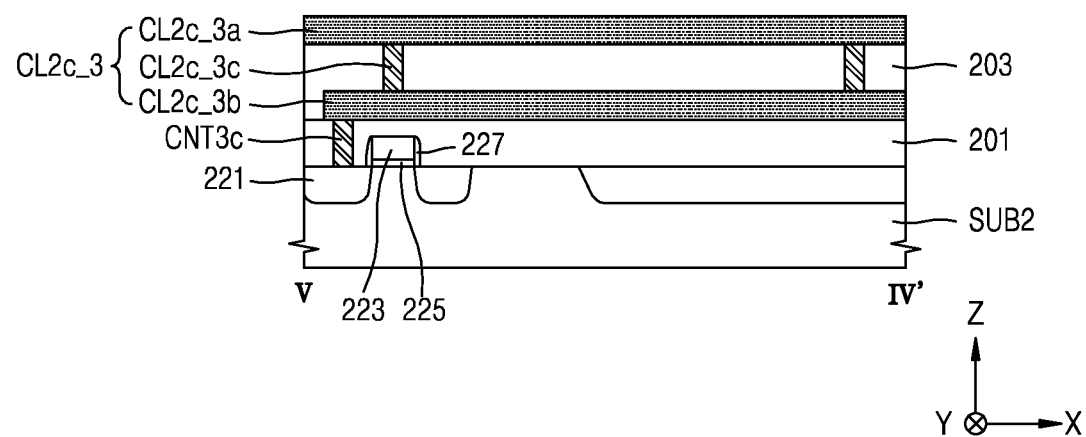
FIG. 18B is a cross-sectional view of the layout, taken along the line V-V shown in FIG. 18A.

FIG. 18A is a layout diagram further illustrating the second wiring lines shown in FIG. 11B according to yet another embodiment of the inventive concept, and FIG. 18B is a cross-sectional view of the layout of FIG. 18A taken along the line V-V'.

Referring to FIGS. 18A and 18B, a plurality of the pass transistors TR_P may be respectively connected to a plurality of gate conductive layers (e.g., G1 through G6 in FIG. 11B) through a plurality of the first contacts CNT1a, CNT1b, and CNT1c, a plurality of the first wiring lines CL1a, CL1b, and CL1c, a plurality of the second contacts CNT2a, CNT2b, and CNT2c, a plurality of second wiring lines CL2a, CL2b, and CL2c_3, and a plurality of the third contacts CNT3a, CNT3b, and CNT3c.

Here, at least one wiring line (e.g., CL2c_3) among the second wiring lines CL2a, CL2b, and CL2c_3 may include conductive lines CL2c_3a and CL2c_3b formed at different levels. The conductive lines CL2c_3a and CL2c_3b formed at different levels may be connected to each other through a via structure CL2c_3c penetrating through the interlayer insulating film 203 placed between the conductive lines CL2c_3a and CL2c_3b. Some other wiring lines CL2a and CL2b among the second wiring lines CL2a, CL2b, and CL2c_3 may respectively include conductive lines which have the same width and are formed at the same level. Accordingly, the total resistance of the at least one second wiring line CL2c_3 may be reduced with respect to the other second wiring lines CL2a and CL2b.

In some embodiments, among the second wiring lines CL2a, CL2b, and CL2c_3, a second wiring line including a plurality of conductive lines formed at different levels may be determined based on a resistance value of each of the gate conductive layers G1 through G6 respectively connected to the second wiring lines CL2a, CL2b, and CL2c_3. For example, a second wiring line connected to a gate conductive layer having the highest resistance among the gate conductive layers G1 through G6 vertically stacked on one another may include a plurality of conductive lines formed at different levels. In some embodiment, the second wiring line CL2c_3 connected to the gate conductive layer G6 at the top among the gate conductive layers G1 through G6 may include the conductive lines CL2c_3a and CL2c_3b formed at different levels.

Referring collectively to FIGS. 11A, 11B, 12, 13, 14A, 14B, 15, 16, 17, 18A and 18B, the second wiring lines CL2 may include at least one wiring line among the second wiring line CL2c_1 shown in FIG. 16, the second wiring line CL2c_2 shown in FIG. 17, and the second wiring line CL2c_3 shown in FIG. 18B. Therefore, according to some embodiments of the inventive concept, a memory device may be manufactured taking into account process environments or placement of wiring lines and may be configured to decrease the resistance of some row lines connecting a plurality of pass transistors and a memory cell array, which are formed in a peripheral circuit area.

Referring back to FIGS. 11A and 11B, the nonvolatile memory device 100b may include at least one among the first wiring lines CL1c_1, CL1c_2, and CL1c_3 shown in FIGS. 12 through 14B, the second contact CNT2C_1 shown in FIG. 15, and the second wiring lines CL2c_1, CL2c_2, and CL2c_3 shown in FIGS. 16, 17, 18A and 18B.

Figure 19:
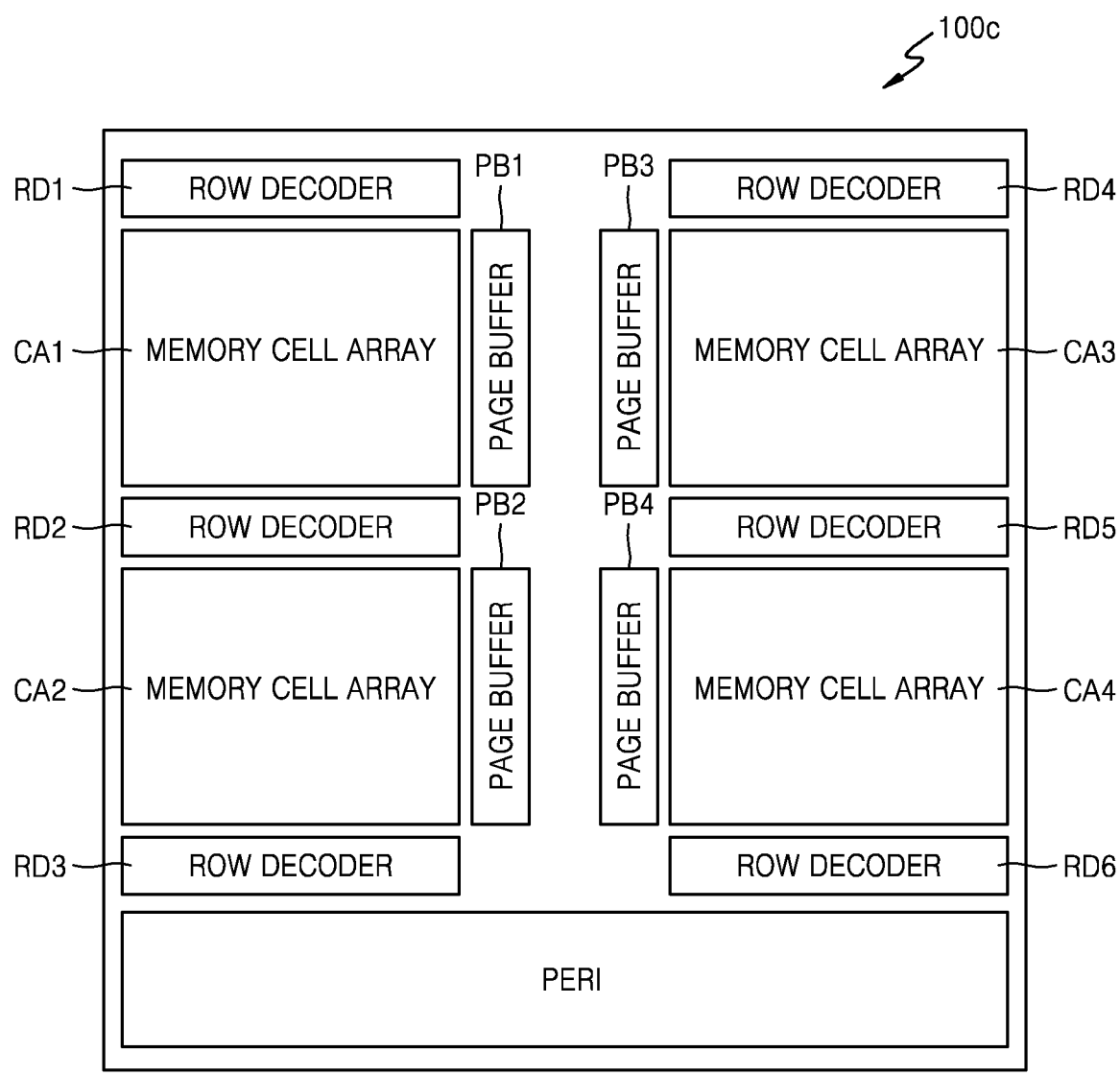
FIG. 19 is a layout diagram for explaining the placement of a row decoder included in a nonvolatile memory device, according to an embodiment of the inventive concept.

FIG. 19 is a layout diagram illustrating possible placement of row decoder(s) included in a nonvolatile memory device according to an embodiment of the inventive concept;

Referring to FIG. 19, a nonvolatile memory device 100c may be implemented in a semiconductor chip. The semiconductor chip may include memory cell array areas CA1 through CA4, row decoder areas RD1 through RD6, page buffer areas PB1 through PB4, and the peripheral circuit area PERI. The row decoder areas RD1 through RD6 are adjacent to the memory cell array areas CA1 through CA4 in the first direction. Row decoders may be placed in the row decoder areas RD1 through RD6. The page buffer areas PB1 through PB4 may be placed adjacent to the memory cell array areas CA1 through CA4 in the second direction. A plurality of page buffers may be placed in the page buffer areas PB1 through PB4. The operation of the page buffers will be described in some additional detail with reference to FIGS. 20A and 20B hereafter.

The memory cell array areas CA1 through CA4, the row decoder areas RD1 through RD6, and the page buffer areas PB1 through PB4 may be placed side by side in parallel with the main surface of a substrate. A data I/O circuit and the like may be placed in the peripheral circuit area PERI.

The descriptions of the memory cell array areas CA1 and CA2 and the row decoder areas RD1, RD2, and RD3 shown in FIG. 6 may be applied to the memory cell array areas CA1 through CA4 and the row decoder areas RD1 through RD6 shown in FIG. 19. Although four memory cell array areas, six row decoder areas, and four page buffer areas are illustrated in FIG. 19, the inventive concept is not limited thereto. The numbers of memory cell array areas, row decoder areas, and page buffer areas may vary with design.

Figure 20A:
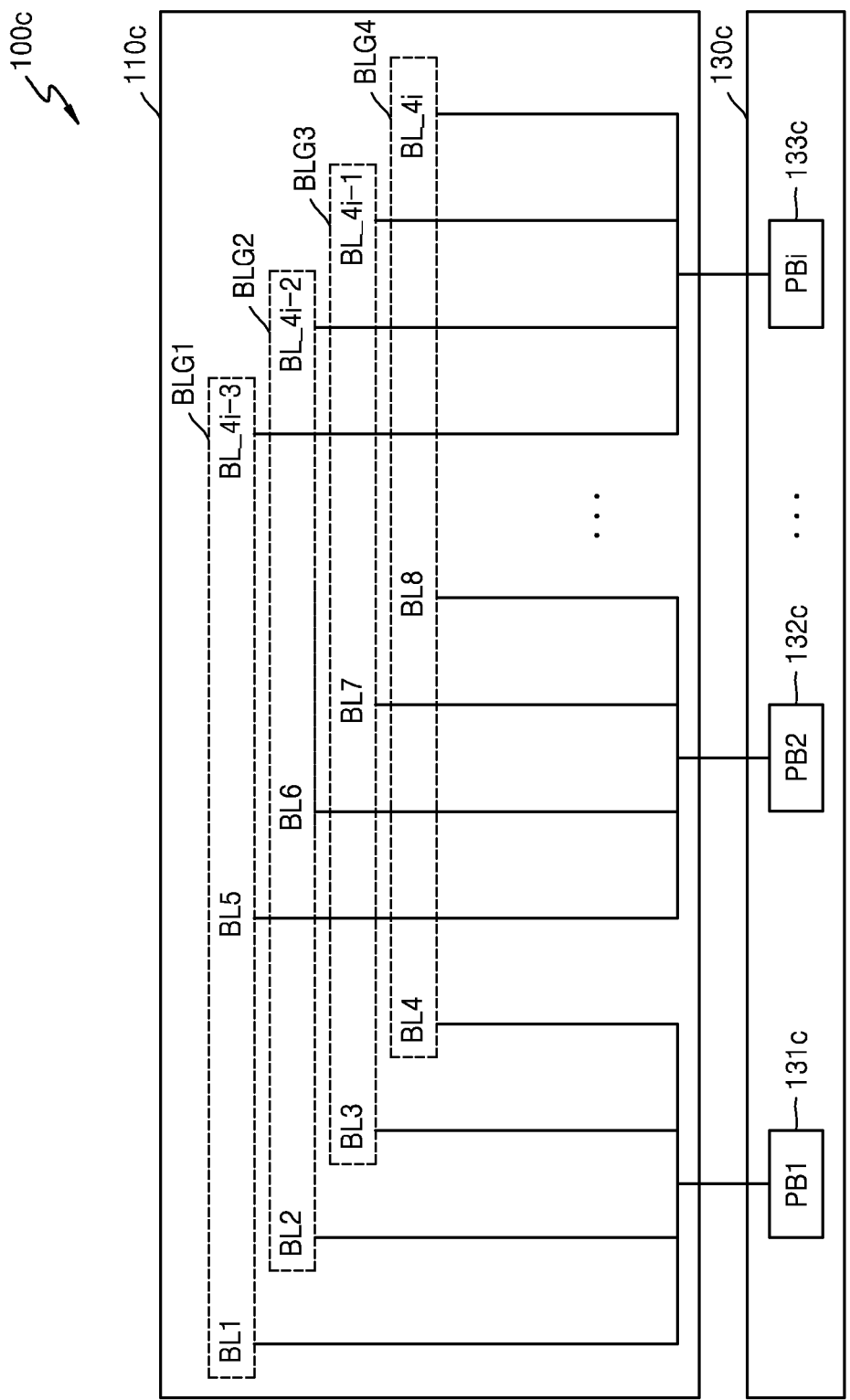
FIG. 20A is a diagram of a memory device including a page buffer unit having a quadruple bit line (QBL) structure, according to an embodiment of the inventive concept.

FIG. 20A is a block diagram further illustrating the nonvolatile memory device 100c including a page buffer unit having a quadruple bit line (QBL) structure according to an embodiment of the inventive concept.

Referring to FIG. 20A, the memory cell array 110c may be connected to a plurality of bit lines BL1 through BL_4i, where "i" is an integer of at least 3. A page buffer unit 130c may include a plurality of page buffers 131c through 133c. In some embodiments, the number of the page buffers 131c through 133c may be "i", and the number of the bit lines BL1 through BL_4i may be 4i. Here, four bit lines (e.g., BL1 through BL4) may be connected to one page buffer (e.g., 131c), and therefore, the page buffer unit 130c may be referred to as a QBL structure page buffer.

The bit lines BL1 through BL_4i may be divided into first through fourth bit line groups BLG1 through BLG4. A program order of the first through fourth bit line groups BLG1 through BLG4 may vary. For example, the first bit line group BLG1 may include the bit lines BL1, BL5, and BL_4i-3, the second bit line group BLG2 may include the bit lines BL2, BL6, and BL_4i-2, the third bit line group BLG3 may include the bit lines BL3, BL7, and BL_4i-1, and the fourth bit line group BLG4 may include the bit lines BL4, BL8, and BL_4i.

The first through fourth bit lines BL1 through BL4 respectively included in the first through fourth bit line groups BLG1 through BLG4 may share one page buffer 131c. Here, program operations on the first through fourth bit line groups BLG1 through BLG4 may be sequentially performed. In other words, program operations on memory cells connected to the first through fourth bit lines BL1 through BL4 may be sequentially performed.

Figure 20B:
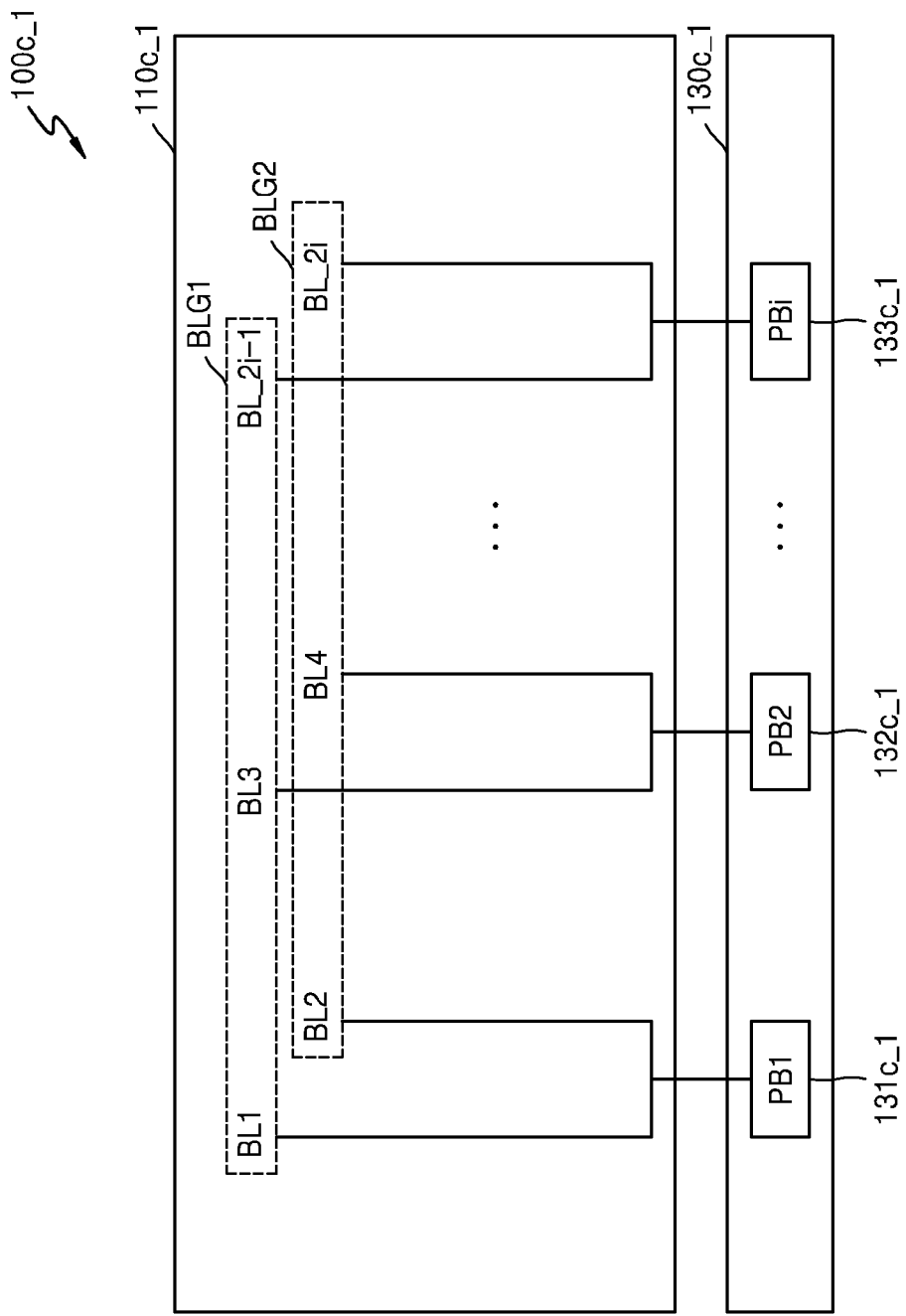
FIG. 20B is a diagram of a memory device including a page buffer unit having a shielded bit line (SBL) structure, according to an embodiment of the inventive concept.

FIG. 20B is another block diagram illustrating a nonvolatile memory device 100c_1 including a page buffer unit having a shielded bit line (SBL) structure according to an embodiment of the inventive concept.

Referring to FIG. 20B, a memory cell array 110c_1 may be connected to a plurality of bit lines BL1 through BL_2i, where "i" is an integer of at least 3. A page buffer unit 130c_1 may include a plurality of page buffers 131c_1 through 133c_1. In some embodiments, the number of the page buffers 131c_1 through 133c_1 may be "i", and the number of the bit lines BL1 through BL_2i may be 2i. Here, two bit lines (e.g., BL1 and BL2) may be connected to one page buffer (e.g., 131c_1), and therefore, the page buffer unit 130c_1 may be referred to as an SBL structure page buffer.

The bit lines BL1 through BL_2i may be divided into first and second bit line groups BLG1 and BLG2. A program order of the first and second bit line groups BLG1 and BLG2 may vary. For example, the first bit line group BLG1 may include the bit lines BL1, BL3, and BL_2i-1, and the second bit line group BLG2 may include the bit lines BL2, BL4, and BL_2i. The first and second bit lines BL1 and BL2 respectively included in the first and second bit line groups BLG1 and BLG2 may share one page buffer 131c_1. Here, program operations on the first and second bit line groups BLG1 and BLG2 may be sequentially performed. In other words, program operations on memory cells connected to the first and second bit lines BL1 and BL2 may be sequentially performed.

Figure 21:
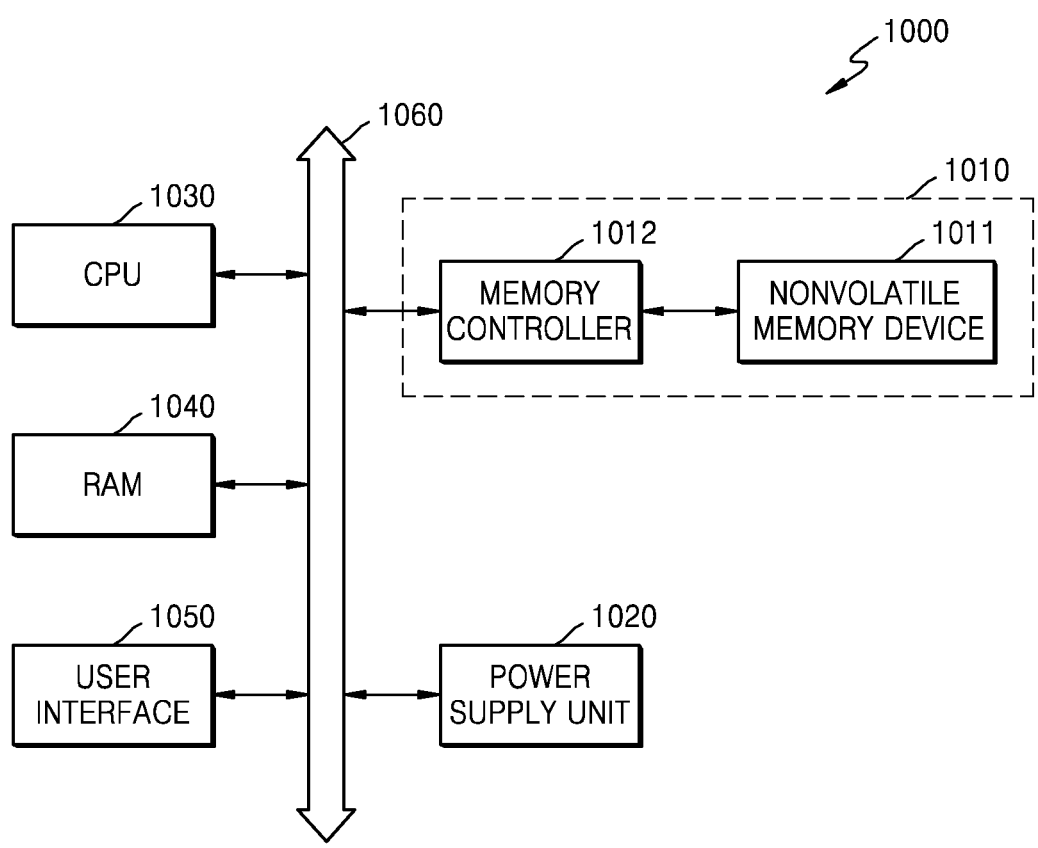
FIG. 21 is a diagram of a computing system including a nonvolatile memory device, according to an embodiment of the inventive concept.

FIG. 21 is a block diagram of a computing system that may incorporate a nonvolatile memory device according to an embodiment of the inventive concept.

Referring to FIG. 21, a computing system 1000 may include a central processing unit (CPU) 1030, a user interface 1050, and a nonvolatile memory system 1010, which are electrically connected to a bus 1060. The nonvolatile memory system 1010 includes a memory controller 1012 and a nonvolatile memory device 1011.

The nonvolatile memory device 1011 may include the nonvolatile memory device 100a shown in FIGS. 6 and 7A, the nonvolatile memory device 100b shown in FIG. 11A, or the nonvolatile memory device 100c shown in FIG. 19. Accordingly, in the nonvolatile memory device 1011, the resistance of a row line connecting a memory cell array to a pass transistor included in a row decoder may be reduced.

The computing system 1000 may also include RAM 1040 and a power supply unit 1020.

When the computing system 1000 is a mobile device, a battery supplying an operating voltage and a modem such as a baseband chipset may be additionally provided. It is obvious to those skilled in the art that an application chipset, a camera image processor, mobile dynamic RAM (DRAM), etc. may also be provided for the computing system 1000, and therefore, detailed descriptions thereof will be omitted.

The memory controller 1012 and the nonvolatile memory device 1011 may form, for example, a solid state drive/disk (SSD) using nonvolatile memory to store data.

While the inventive concept has been particularly shown and described with reference to embodiments thereof, it will be understood that various changes in form and details may be made therein without departing from the spirit and scope of the following claims.

What is claimed is:

1. A nonvolatile memory device comprising:
a vertically stacked memory cell array formed on a substrate having a main surface; and
a row decoder supplying a row line voltage to the vertically stacked memory cell array through a plurality of row lines, wherein:
the row decoder comprises a plurality of pass transistors, such that each one of the plurality of row lines comprises at least one wiring line connected to the vertically stacked memory cell array and at least one of the pass transistors,
one of the plurality of row lines comprises a plurality of wiring lines connected to each other in parallel between first and second contacts and others of the plurality of row lines do not comprise a plurality of wiring lines connected to each other in parallel, each of the plurality of wiring lines having the same width,
the plurality of wiring lines extending in a direction parallel to the main surface of the substrate, and the first and second contacts extending in a direction perpendicular to the main surface of the substrate, and
the vertically stacked memory cell array comprises a plurality of gate conductive layers, and the one of the plurality of row lines is connected to a gate conductive layer among the plurality of gate conductive layers having a highest resistance value.

2. The nonvolatile memory device of claim 1, wherein the plurality of wiring lines comprises a first conductive line and a second conductive line formed at a same level from the main surface of the substrate.

3. The nonvolatile memory device of claim 1, wherein the plurality of wiring lines comprises a first conductive line and a second conductive line respectively formed at different levels from the main surface of the substrate.

4. The nonvolatile memory device of claim 3, wherein the one of the plurality of row lines further comprises a via structure connecting the first conductive line and the second conductive line.

5. The nonvolatile memory device of claim 1, wherein the vertically stacked memory cell array and the row decoder are placed side by side in parallel with the main surface of the substrate.

6. A nonvolatile memory device comprising:
a peripheral circuit area formed on a substrate having a main surface and comprising a plurality of pass transistors; and
a memory cell array formed on the peripheral circuit area in a vertically stacked structure, the memory cell array being connected to the pass transistors through a plurality of row lines, wherein:
each of the row lines comprises a first wiring line formed on an upper layer of the memory cell array from the main surface of the substrate, a second wiring line formed in the peripheral circuit area, and a contact connecting the first wiring line with the second wiring line,
at least one among the first wiring line, the contact, and the second wiring line in a first row line among the row lines comprises a plurality of conductive lines connected in parallel to each other and others of the row lines do not comprise a plurality of conductive lines connected in parallel to each other, and
the memory cell array comprises a plurality of gate conductive layers, and the first row line is connected to a gate conductive layer having a highest resistance among the plurality of gate conductive layers.

7. The nonvolatile memory device of claim 6, wherein the first wiring line in each of the row lines have a same width.

8. The nonvolatile memory device of claim 6, wherein the second wiring line in each of the row lines have a same width.

9. The nonvolatile memory device of claim 6, wherein in the first row line the first wiring line comprises the plurality of conductive lines including a first conductive line and a second conductive line, and the first and second conductive lines are formed at a same level as the main surface of the substrate.

10. The nonvolatile memory device of claim 6, wherein in the first row line the first wiring line comprises the plurality of conductive lines including a first conductive line and a second conductive line, and the first and second conductive lines are formed at different levels than the main surface of the substrate.

11. The nonvolatile memory device of claim 6, wherein in the first row line the second wiring line comprises the plurality of conductive lines including a first conductive line and a second conductive line, and the first and second conductive lines are formed at a same level from a main surface of the substrate.

12. The nonvolatile memory device of claim 6, wherein in the first row line the second wiring line comprises the plurality of conductive lines including a first conductive line and a second conductive line, and the first and second conductive lines are formed at different levels than the main surface of the substrate.

13. The nonvolatile memory device of claim 6, wherein in the first row line the contact comprises a plurality of contacts connecting the first and second wiring lines.

14. A nonvolatile memory device comprising:
a vertically stacked memory cell array formed on a substrate having a main surface; and
a row decoder supplying a row line voltage to the vertically stacked memory cell array, the row decoder comprising a plurality of pass transistors, wherein:
the row line voltage is supplied through a plurality of row lines connecting the pass transistors to the vertically stacked memory cell array,
each of the row lines comprises a wiring line parallel with the main surface of the substrate and a contact perpendicular to the main surface of the substrate,
at least part of a wiring line of a first row line among the plurality of row lines has a first width wider than all widths of wiring lines of other row lines among the plurality of row lines,
the vertically stacked memory cell array comprises a plurality of gate conductive layers, and the first row line is connected to a gate conductive layer having a highest resistance among the plurality of gate conductive layers, and
the wiring lines of the row lines other than the first row line have a same width that is less than the first width.

15. The nonvolatile memory device of claim 14, wherein the vertically stacked memory cell array and the row decoder are placed side by side in parallel with the main surface of the substrate.

\* \* \* \* \*